US008126664B2

(12) United States Patent
Fournier et al.

(10) Patent No.: US 8,126,664 B2
(45) Date of Patent: Feb. 28, 2012

(54) DETECTION, LOCALIZATION AND INTERPRETATION OF PARTIAL DISCHARGE

(75) Inventors: Daniel Fournier, Montréal (CA); Bruno Cantin, Sainte-Julie (CA); Jean-Marc Bourgeois, Longueuil (CA); François Léonard, Montréal (CA); Yvan Roy, Beloeil (CA)

(73) Assignee: Hydro-Québec, Montreal QC (CA)

( * ) Notice: Subject to any disclaimer, the term of this patent is extended or adjusted under 35 U.S.C. 154(b) by 703 days.

(21) Appl. No.: 11/920,612

(22) PCT Filed: May 18, 2006

(86) PCT No.: PCT/CA2006/000811
§ 371 (c)(1),
(2), (4) Date: Jan. 27, 2009

(87) PCT Pub. No.: WO2006/122415
PCT Pub. Date: Nov. 23, 2006

(65) Prior Publication Data
US 2009/0177420 A1 Jul. 9, 2009

(30) Foreign Application Priority Data

May 20, 2005 (CA) .................................... 2508428

(51) Int. Cl.
*G01R 31/08* (2006.01)
*G06F 17/40* (2006.01)
(52) U.S. Cl. ................ 702/59; 702/58; 702/72; 702/76; 324/500; 324/512; 324/521
(58) Field of Classification Search .................... 702/59, 702/58, 72, 76, 78, 79
See application file for complete search history.

(56) References Cited

U.S. PATENT DOCUMENTS

| 3,991,364 | A |   | 11/1976 | Wiznerowicz |
| 4,967,158 | A | * | 10/1990 | Gonzalez ...................... 324/536 |
| 5,444,380 | A | * | 8/1995  | Bourgeois et al. ............ 324/529 |
| 5,530,364 | A |   | 6/1996  | Mashikian et al. |
| 5,642,038 | A |   | 6/1997  | Kim et al. |

(Continued)

FOREIGN PATENT DOCUMENTS

CA 2455206 A1 7/2004

(Continued)

OTHER PUBLICATIONS

Conference on Electrical Insulation and Dielectric Phenomena, 2001 Annual Report, Oct. 2001, pp. 315-318, Zheng et al.: *Comparison of Feature Extraction Methods in Partial Discharge Waveform Recognition.*

(Continued)

*Primary Examiner* — Hal Wachsman
(74) *Attorney, Agent, or Firm* — Muirhead and Saturnelli, LLC

(57) ABSTRACT

In order to detect, localize and interpret a partial discharge occurring in a partial discharge site along an electrical equipment, two measurement probes and a synchronization probe are installed along the electrical equipment. The measurement probes detect pulses travelling in the electrical equipment while the synchronization probe detects a phase angle in the electrical equipment and is usable for calibration purposes. A control unit receives the signals sensed by the probes and conditions them. Digital processing applied on the conditioned signals, involving their correlation, a time-frequency distribution and a form factor estimation, allows establishing a diagnosis indicating a detection of a partial discharge and its localization along the electrical equipment. A wideband magnetic probe may be provided for detecting the pulses traveling in the electrical equipment.

28 Claims, 18 Drawing Sheets

U.S. PATENT DOCUMENTS

| | | | |
|---|---|---|---|
| 5,767,684 A * | 6/1998 | Steennis | 324/536 |
| 5,814,998 A | 9/1998 | Gruenewald et al. | |
| 5,982,181 A | 11/1999 | Rokunohe et al. | |
| 6,255,808 B1 | 7/2001 | Hücker | |
| 6,297,645 B1 | 10/2001 | Eriksson et al. | |
| 6,392,401 B1 | 5/2002 | Cooke | |
| 6,418,385 B1 | 7/2002 | Hücker | |
| 6,420,879 B2 | 7/2002 | Cooke | |
| 6,448,782 B1 | 9/2002 | Pakonen et al. | |
| 6,483,316 B2 | 11/2002 | Kato et al. | |
| 6,507,181 B1 | 1/2003 | Pakonen et al. | |
| 6,809,523 B1 * | 10/2004 | Ahmed et al. | 324/520 |
| 7,903,749 B2 | 3/2011 | Moffatt | |
| 7,917,766 B2 | 3/2011 | Sewell et al. | |
| 7,949,520 B2 | 5/2011 | Nongpiur et al. | |
| 7,953,600 B2 | 5/2011 | Hertz et al. | |
| 7,979,270 B2 | 7/2011 | Yamada | |
| 7,981,040 B2 | 7/2011 | Trucco et al. | |
| 8,005,239 B2 | 8/2011 | Samadani | |
| 2004/0263179 A1 | 12/2004 | Ahmed et al. | |

FOREIGN PATENT DOCUMENTS

| | | |
|---|---|---|
| EP | 402906 A3 | 12/1990 |
| EP | 1094323 A2 | 4/2001 |
| EP | 1477820 A2 | 11/2004 |
| WO | WO 96/35250 | 11/1996 |
| WO | WO 2004/005947 A1 | 1/2004 |

OTHER PUBLICATIONS

Kawada, et al., "Detection of Wide-Band E-M Signals Emitted from Partial Discharge Occurring in GIS Using Wavelet Transform," IEEE Transactions on Power Delivery, vol. 15, No. 2, Apr. 2000, 467-471.

Lee, et al., "Time-frequency Analysis of VHF Wave form for Precise Location of Partial Discharge in Small-scale High Voltage Apparatuses," Proceedings of the 7th International Conference on Properties and Applications of Dielectric Materials, Jun. 1-5, 2003, 343-346.

* cited by examiner

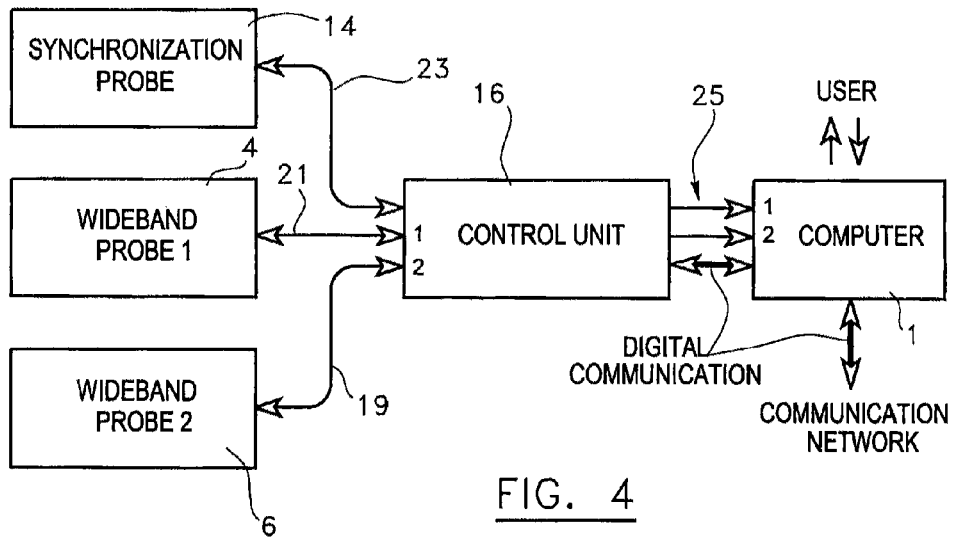
FIG. 4
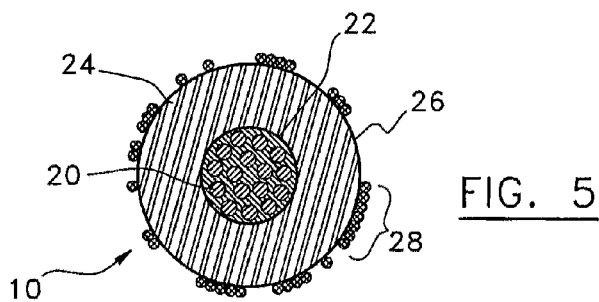
FIG. 5
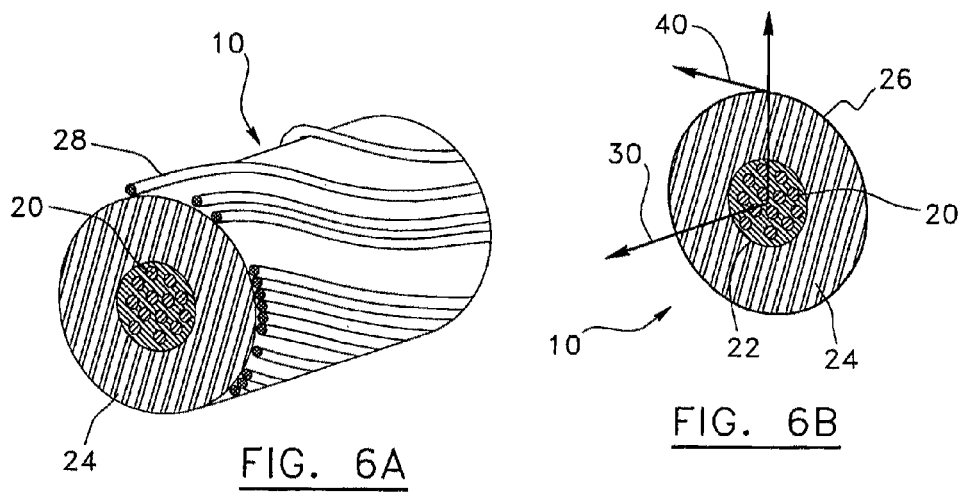
FIG. 6A
FIG. 6B

DETECTION, LOCALIZATION AND INTERPRETATION OF PARTIAL DISCHARGE

FIELD OF THE INVENTION

The invention relates to an apparatus for detection, localization and interpretation of partial discharge, for example in an electrical accessory of an underground power distribution network, or in any other kind of electrical equipment located in any environment.

BACKGROUND

Power failures may occur at cable joints in underground conduit networks. Some are due to partial discharges inside the joints and the corresponding degradation of their electrical insulation.

Diagnosis of underground cables and their accessories or equipment is desirable for safety issues, and for performing predictive maintenance and removing defective accessories or equipment before failure.

U.S. Pat. No. 6,809,523 (Ahmed et al.), U.S. Pat. No. 5,530,364 (Mashikian et al.), U.S. Pat. No. 5,767,684 (Steennis), U.S. Pat. No. 6,420,879 (Cooke), U.S. Pat. No. 6,507,181 (Pakonen et al.), U.S. Pat. No. 6,418,385 (Hücker et al.), U.S. Pat. No. 6,255,808 (Hücker), U.S. Pat. No. 6,297,645 (Eriksson et al.), U.S. Pat. No. 6,392,401 (Cooke), U.S. Pat. No. 5,642,038 (Kim et al.) and CA (Canadian) patent No. 2,455,206 (Wendel et al.) disclose certain methods and various devices for detecting partial discharges which are however not much reliable, imprecise, sensitive to noise, rudimentary, cumbersome, limited to some specific equipment to be tested, require that the equipment to be tested be out of service, or else difficult to be practically implemented due to manipulations requiring uncommon dexterity.

Partial discharges may also occur in a variety of electrical devices or equipment, and are often forerunners of more serious damages to follow if nothing is done to repair or replace the possibly defective equipment.

SUMMARY

According to an aspect of the invention, there is provided an apparatus for detection, localization and interpretation of partial discharge that outdo the apparatuses known in the art.

According to another aspect of the invention, there is provided an apparatus for detecting, localizing and interpreting a partial discharge occurring in a partial discharge site along an electrical equipment, comprising:

two measurement probes and a synchronization probe installable along the electrical equipment so that pulses travelling in the electrical equipment are detectable by the measurement probes and a phase angle in the electrical equipment is detectable by the synchronization probe;

a control unit connecting to the measurement probes for receiving signals representative of the detected pulses, and connecting to the synchronization probe for acquiring a signal representative of the detected phase angle, the control unit having a circuit for selective conditioning of the received signals; and a digital processing unit connecting to the control unit for acquiring the signals after selective conditioning as a function of the detected phase angle and driving the control unit, the digital processing unit having a correlation measuring module for measuring correlation of the acquired signals, a module for performing a time-frequency distribution of at least one of the acquired signals, a form factor estimating module for estimating a form factor derived from the time-frequency distribution, and a diagnosis module responsive to results generated by the correlation measuring and form factor estimating modules for generating a diagnosis indicative of a detection of a partial discharge and of its localization along the electrical equipment.

Preferably, the processing unit further comprises a candidate eliminating module for eliminating candidates of diagnosis solutions corresponding to traces in the acquired signals derived from detected pulses having out-of-range propagation delays between the measurement probes.

A threshold for delays considered as being out-of-range by the candidate eliminating module may be set by the user. The control unit may further comprise a circuit for generating a test signal transmitted to the synchronization probe that injects it in the electrical equipment. Thus, the digital processing unit may determine the propagation delay between the measurement probes from the acquired signals corresponding to pulses detected by the measurement probes caused by the test signal injected in the electrical equipment. The threshold for delays considered to be out-of-range may then be set as a function of the propagation delay so determined. The digital processing unit may alternatively or concurrently check a configuration of the measurement probes as a function of the acquired signals corresponding to the test signal injected in the electrical equipment, e.g. based on the polarity or the acquired signals.

Preferably, the processing unit further comprises a module for estimating a probability of error as a function of a ratio between a peak of a maximum of correlation among other correlation peaks, a warning signal indicative of a second probable candidate of diagnosis explanation being produced when the probability of error exceeds a preset threshold.

Preferably, the processing unit further detects typical traces of radiation in the acquired signals. When it is established that the acquired signals correspond to radiation, their processing is stopped and a "radiation" diagnosis is retained.

Preferably, the correlation measuring module provides the diagnosis module with a signal indicative of the polarities of the pulses in the acquired signals, a correlation factor of the correlated signals, a temporal trace portion of a higher amplitude discharge, and a temporal distance between a same discharge sensed by the measurement probes.

Preferably, the processing unit further comprises a module for estimating an equivalent bandwidth and a rise time of the higher amplitude discharge, both provided to the diagnosis module.

According to another aspect of the invention, there is provided a method for detecting, localizing and interpreting a partial discharge occurring in a partial discharge site along an electrical equipment, comprising:

detecting pulses travelling in the electrical equipment using two measurement probes spaced from each other along the electrical equipment;

detecting a phase angle in the electrical equipment using a synchronization probe positioned along the electrical equipment;

performing a selective conditioning of signals representative of the detected pulses;

acquiring the signals after the selective conditioning as a function of the detected phase angle;

putting the acquired signals in correlation;

presenting at least one of the acquired signals in a time-frequency distribution;

estimating a form factor derived from the time-frequency distribution; and establishing a diagnosis indicative of a detection of a partial discharge and of its localization along the electrical equipment as a function of results from the correlation and the form factor.

Preferably, the method may further comprise: eliminating candidates of diagnosis solutions corresponding to traces in the acquired signals derived from detected pulses having out-of-range propagation delays between the measurement probes.

The method may further comprise:

generating a test signal transmitted to the synchronization probe that injects it in the electrical equipment; and determining the propagation delay between the measurement probes from the acquired signals corresponding to the pulses detected by the measurement probes caused by the test signal injected in the electrical equipment, the threshold for delays considered to be out-of-range being then set as a function of the propagation delay so determined.

The test signal may also be used to check a configuration of the measurement probes, for example as a function of the polarities of the acquired signals corresponding to the test signal injected in the electrical equipment.

Among other possible steps of the method are:

estimating a probability of error as a function of a ratio between a peak of a maximum of correlation among other correlation peaks, a warning signal indicative of a second probable candidate of diagnosis explanation being produced when the probability of error exceeds a preset threshold;

detecting typical traces of radiation in the acquired signals, their processing being stopped and a "radiation" diagnosis being retained when it is established that the acquired signals correspond to radiation;

establishing the diagnosis based also on a signal indicative of the polarities of the pulses in the acquired signals, a correlation factor of the correlated signals, a temporal trace portion of a higher amplitude discharge, a temporal distance between a same discharge sensed by the measurement probes, an equivalent bandwidth and a rise time of the higher amplitude discharge;

interpolating the acquired signals before correlation;

clusterizing the acquired signals prior to the correlation to group the acquired signals that are similar.

According to another aspect of the invention, there is provided a wideband magnetic probe for detecting pulses traveling in an electrical equipment caused by a partial discharge, comprising:

a removable clamp having a conductive loop forming a magnetic sensing circuit apt to surround a section of the electrical equipment in order to sense a signal representing a magnetic component of the pulses traveling in the electrical equipment;

a conductive shield covering and electrostatically insulating the conductive loop, the conductive shield being in open circuit at opposite ends of the clamp so that a gap appears between the ends of the clamp;

a connector closing the circuit of the conductive loop at the ends of the clamp where the gap is located when the clamp is installed around the electrical equipment; and a connector for establishing an external electrical connection with the circuit of the conductive loop.

Preferably, the wideband magnetic probe further comprises an amplifier circuit, possibly having a controlled gain, integrated in the conductive shield and inserted in the conductive loop in order to filter and amplify the signal.

According to another aspect of the invention, there is provided an apparatus for detecting partial discharges in an electrical equipment, comprising:

a measurement probe and a synchronization probe installable along the electrical equipment so that pulses travelling in the electrical equipment are detectable by the measurement probe and a signal indicative of a phase angle in the electrical equipment is detectable by the synchronization probe;

a control unit connecting to the measurement probe for receiving signals representative of the detected pulses, and connecting to the synchronization probe for acquiring the signal indicative of the phase angle, the control unit having a circuit for selective conditioning of the received signals; and a digital processing unit connecting to the control unit for acquiring the signals after selective conditioning as a function of an appraisal of the phase angle and driving the control unit, the digital processing unit having a clusterization module for clusterizing the acquired signals into respective clusters and producing signatures characterizing the signals in the clusters, a module for performing a time-frequency distribution of the signatures, a form factor estimating module for estimating a form factor derived from the time-frequency distribution, a module for determining rise times of the signatures, and a diagnosis module responsive to results generated by the form factor estimating module and the module for determining rise times for generating a diagnosis indicative of a detection of partial discharges and producing a warning signal as a function of the diagnosis.

According to another aspect of the invention, there is provided a method for detecting partial discharges in an electrical equipment, comprising:

detecting pulses travelling in the electrical equipment using a measurement probe positioned along the electrical equipment;

detecting a signal indicative of a phase angle in the electrical equipment using a synchronization probe positioned along the electrical equipment;

performing selective conditioning of signal representative of the detected pulses;

acquiring the signals after the selective conditioning as a function of an appraisal of the phase angle;

clusterizing the acquired signals into clusters and producing signatures characterizing the signals in the clusters;

presenting the signatures in a time-frequency distribution;

estimating a form factor derived from the time-frequency distribution;

determining rise times of the signatures;

establishing a diagnosis indicative of a detection of partial discharges as a function of results from the form factor and the rise times; and producing a warning signal as a function of the diagnosis.

The following provides an outline of other possibly preferable and non-restrictive features of the invention, which will be more fully described hereinafter.

The apparatus is preferably portable, autonomous and apt to perform the detection when the electrical line or equipment to be tested is in service. With the apparatus, a reliable diagnosis regarding the nature of the discharge site and the health condition of the equipment may be obtained. The apparatus may be operated from a remote location from the measurement site and has probes whose installation is achieved in a minimum of time to increase the security level of the workers. Strong and improved probes are proposed for detecting a partial discharge, in particular in the form of wideband magnetic probes comprising a controlled gain amplifier. A test procedure allows checking the working condition of the probes, determining the parameters used to establish the diagnosis, and calibrating the whole apparatus. The apparatus uses correlation, synchronization and form factor estimation procedures on the measured signals in order to establish and unequaled diagnosis.

The apparatus and the method are highly versatile. They may be used whenever there is a need to verify if an electrical accessory or equipment is plagued with partial discharges. For example, it may be used to check transformers, switch gears, batteries, capacitors, dielectric containing components, entertainment or communication systems, medical equipment, etc., no matter whether some of their operating parts are solid, liquid or gas. They may be used to test electrical equipment located anywhere, underground, overhead, on an airplane, a train, a vehicle, a boat, in a plant, etc.

BRIEF DESCRIPTION OF THE DRAWINGS

A detailed description of preferred embodiments will be given herein below with reference to the following drawings, in which like numbers refer to like elements.

FIG. 4 is a schematic block diagram illustrating a design of the apparatus for detecting, localizing and interpreting a partial discharge.

FIG. 5 is a schematic diagram illustrating a cross section of a power line cable that may be used in accordance with an embodiment of the system described herein.

FIG. 6A and FIG. 6B are perspective schematic diagrams of a power line cable and magnetic flux circulating in it.

DETAILED DESCRIPTION OF THE PREFERRED EMBODIMENTS

As used in connection with this disclosure, the term "signal" represents an analog and temporal physical unit, typically of current or voltage type, appearing in a continuous form in the time domain.

As used in connection with this disclosure, the term "measurement" represents a series of digital discrete samples derived from a signal sampled during a finite period.

As used in connection with this disclosure, the term "test" represents a set of simultaneous measurements and of available specifications concerning a physical event recorded by the apparatus.

As used in connection with this disclosure, the expression "signal conditioning" represents an action carried out by analog electronics prior to signal digitization.

As used in connection with this disclosure, the expression "signal processing" represents a procedure comprising mathematical manipulations required to confirm the presence of a partial discharge, localize the discharge site and bring out the corresponding physical features.

As used in connection with this disclosure, the term "computer" represents a compatible or other PC computer or equivalent electronics having or provided with a high speed acquisition card.

As used in connection with this disclosure, the expression "control unit" (CU) represents an intelligent interface connecting the computer to the probes.

As used in connection with this disclosure, the expression "partial discharge" represents a spontaneous, simultaneous and short duration local displacement of an electric charge over a short distance in a dielectric subjected to an electric field.

As used in connection with this disclosure, the expression "discharge site" represents a defect localized in a small volume of a dielectric where one or more partial discharges occur most often during application of an electric field although also possible under other circumstances.

As used in connection with this disclosure, the expression "power wave" represents a sinusoidal wave carrying the network or other supplying power at 60 Hz or 50 Hz or another frequency according to the application, for example 400 Hz in the case of airplanes, etc.

As used in connection with this disclosure, the term "phasor" represents a phase angle of the power wave rotating 360° per cycle at the network frequency.

As used in connection with this disclosure, the term "radiation" represents any noise of electric or magnetic nature, having a source external to that of a partial discharge, most often characterized by a greater number of oscillations, a greater propagation delay, a smaller degree of correlation and an inappropriate polarity.

As used in connection with this disclosure, the terms "a", "one", "two", etc., are to be construed non-restrictively unless qualifiers such as "single", "sole", "only" are specified.

Figure 16:
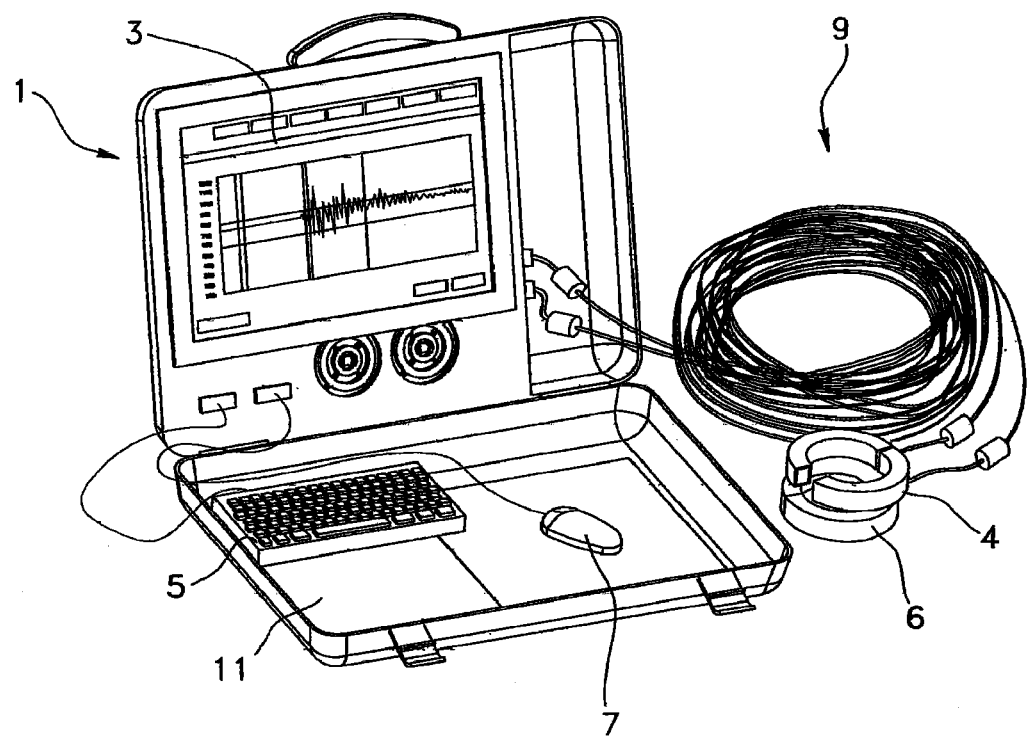
FIG. 16 is a picture illustrating an apparatus for detecting, localizing and interpreting a partial discharge.

Referring to FIG. 16, the apparatus for detecting, localizing and interpreting a partial discharge may be built so as to be portable and autonomous. The apparatus may take the form of a computer 1 provided with a display 3, a keyboard 5 and a mouse 7, and equipment 9, the whole fitting in a case 11. The apparatus especially allows detecting and localizing one or more partial discharge sites present on a high voltage line accessory of an underground power network from a manhole giving access to the network. The apparatus also allows detecting and indicating a direction of a partial discharge source taking place in another manhole linked to the first manhole by the high voltage line. The obtained information allows a reliable diagnosis of the nature of the discharge site and of the health condition of the accessory, e.g. a transformer, a switch gear or other possible equipment. The apparatus allows discriminating the partial discharge signals in presence of several signals from different origins.

Figure 17:
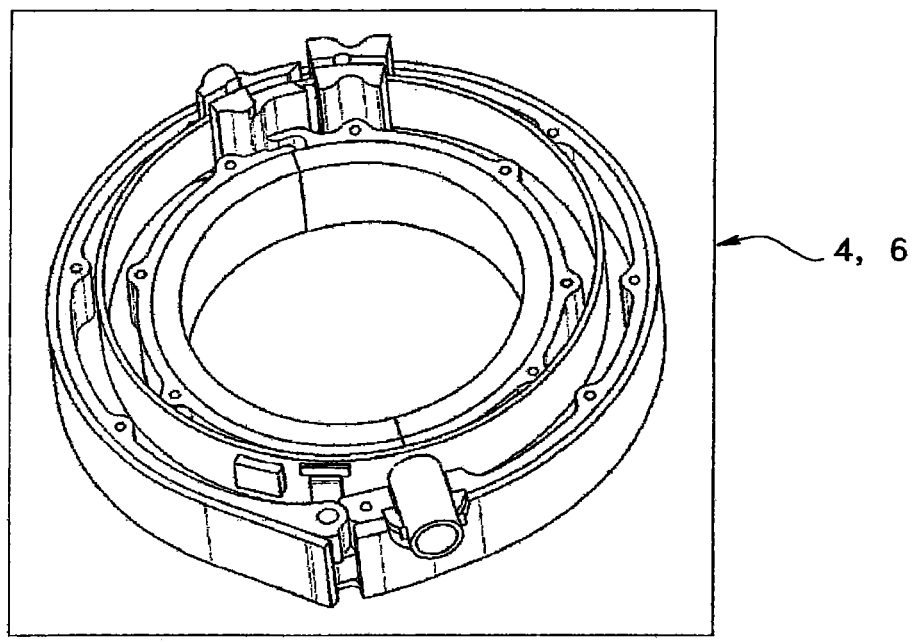
FIG. 17 is a picture illustrating a disassembled wideband probe.

Usually, for considerations of cleanliness for the computer 1, of comfort and of safety for the user, the computer 1 is operated at a distance of a few meters from the measurement site. Depending on the intended use, the probes 4, 6 may be built to be strong, e.g. for rough manipulations in a dirty and wet measurement site. Preferably, the installation of the probes such as the measurement probes 4, 6 should be achievable in a minimum of time to minimize the exposure of the worker to risks inherent to the measurement site. FIG. 17 illustrates a possible construction of the measurement probes 4, 6.

Partial discharges mainly occur during voltage rises associated to the power wave, thus at particular angles of the network phasor. Furthermore, the angular distribution of the dispersion of these discharges contains important diagnosis information since it is a function of the type of the discharge site. Thus, the apparatus ascribes an angular position referenced to the network phasor for each partial discharge (phase resolve partial discharge). The apparatus may also control measurements over predetermined angular portions to target certain discharge sites or obtain an unbiased statistical picture.

Partial discharges have variable durations, as a function of the type of the discharge site, of the geometry of the accessories and of the distance of each measurement probe 4, 6. The shortest ones have a rise time in the order of a few nanoseconds and sometimes less (in the picoseconds) depending on the measuring means and the nature of the discharge. The signal is preferably digitized at one gigasamples or more per second. At this sampling rate, the dead time between two discharges represent a very important volume of data to be digitized and recorded. The digitizing is preferably performed by segments each containing a triggering event. This event may be a partial discharge or noise exceeding the triggering threshold. A high-pass filter 61 (FIG. 11) combined with switchable RF filters 63 allows reducing the noise level at a point where it is possible to control the starting of the sampling on the beginning of a low amplitude partial discharge and that despite the presence of electromagnetic noise.

Figure 1:
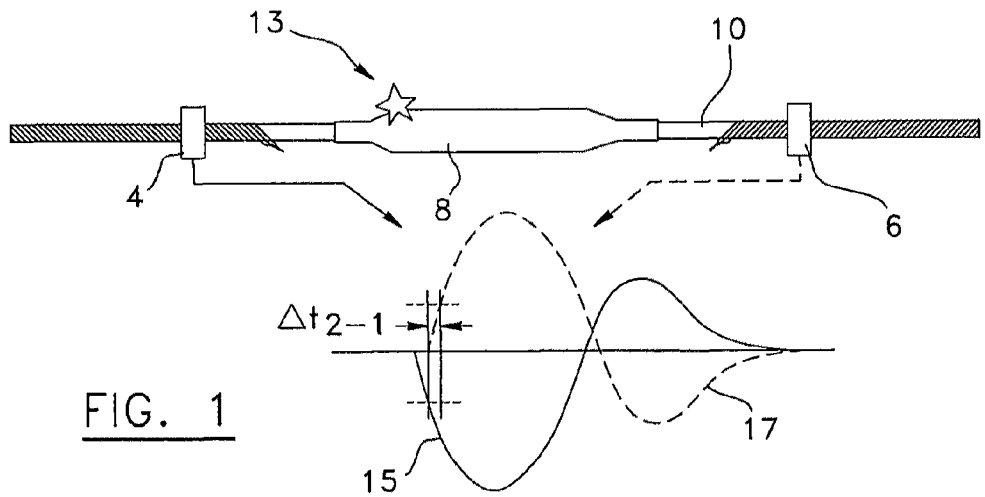
FIG. 1 is a schematic diagram illustrating a partial discharge in an accessory located between two wideband probes.

Referring to FIG. 1, a partial discharge occurring in an accessory 8 or a cable 10 generates an electromagnetic pulse propagating in both cable directions. Two probes 4, 6 located on both sides of a discharge site 13 provide pulses 15, 17 which, once processed and correlated, are indicative of the location of the discharge site 13. Indeed, in such a case, the polarity is opposite and the inter-channel delay is less than the propagation delay of a wave between the two probes 4, 6.

Figure 2:
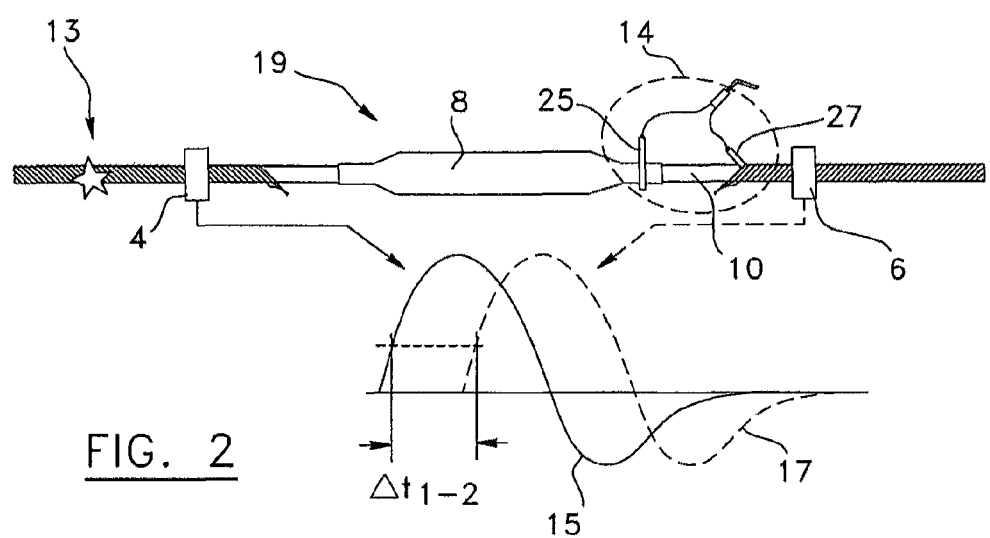
FIG. 2 is a schematic diagram illustrating a partial discharge or signal coming from beyond the two wideband probes, and a possible connection of the synchronization probe.

Referring to FIG. 2, a pulse coming from one side or the other side of the measurement site 19 will appear with the same polarity to both probes 4, 6 and with a delay corresponding approximately to the propagation delay of a wave between both probes 4, 6.

Figure 3:
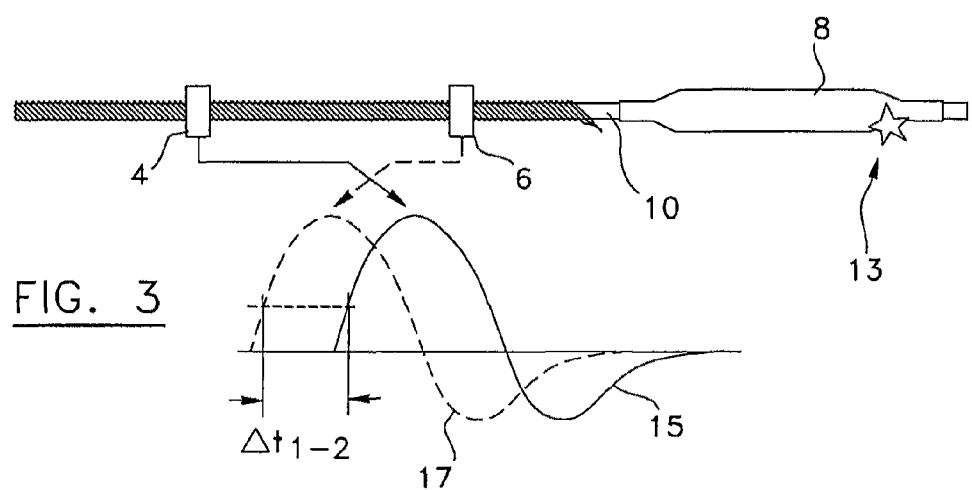
FIG. 3 is a schematic diagram illustrating a partial discharge in an accessory located beyond the two wideband probes.

Referring to FIG. 3, furthermore, two probes 4, 6 located on a same side of a discharge site 13 provide pulses which, once processed and correlated, are indicative of the direction of the discharge site.

It should be noted that the polarity of the sensed wave is a function of the orientation of each probe 4, 6. In a network measurement context, pulses sensed by the probes 4, 6 differ from one another due to the presence of reflections on the surrounding accessories (not illustrated) and due to sensed noise. Furthermore, a partial discharge signal may contain more than one oscillation so that several correlation peaks may exist when the pulses are compared, thus several possible diagnoses. The apparatus thus evaluates which one of the diagnoses is the most probable by associating a value of likeliness to it and by indicating, if relevant, the presence of another diagnosis almost as probable.

The likeliness of the diagnosis is based in part on the configuration of the probes 4, 6 (relative position with respect to the accessory 8 or other equipment under test, location and direction of installation) and the a priori knowledge of the actual propagation delays. In this respect, a first test procedure on a portable testing bench allows estimating accurately the response of each probe 4, 6, including the actual delay. A second test procedure at the measurement site allows measuring the probe-to-probe propagation delay as well as validating the configuration of the test.

Once the test is achieved, followed by validation of the assembly configuration, the test may begin. Since the digitization rate is very high with respect to the available memory, and since, anyway, the discharges are events of very short duration and quite spaced from one another, it is unnecessary to store the whole signal. Only the useful portions of the signal may be memorized. Each portion corresponds to an overrun of a preset threshold level, the overrun being called "event" hereinafter. Many diagnoses may correspond to a given event. During a test, this threshold level is progressively lowered until an acceptable probability of events is observed for the measurement. When the hidden presence of discharges having lower amplitudes than the triggering threshold is suspected, this threshold level must thus be further lowered with the result that a high rate of events do not correspond to discharges. For each test and each threshold, the apparatus records several bursts of events which may cover one or several cycles at the network frequency. For each event, the apparatus displays and stores in memory an automatic diagnosis obtained from correlations, namely if there is presence of a saturated signal, presence of radiation or other inappropriate noise, a discharge between both probes 4, 6, a discharge coming from one side or the other side of the arrangement of probes 4, 6, and presence of a second probable diagnosis explanation.

To each diagnosis is preferably attributed a likeliness factor based on a distribution of possible diagnoses, a factor of correlation between the discharges coming from both probes 4, 6, a form factor corresponding to a ratio of the spectral bandwidth over the time length of the discharge pulse, the value of the network phasor at the time of the event, and an analog (fixed) and digital (variable by the user) processing parameter set.

The user may select the digital processing to be applied, the burst(s) and the test(s) to compile and show on the display 3. The results may then be illustrated in an unprocessed form (text format list) or through various common statistical presentation tools, such as 2D or 3D histograms. These results may be exported for analysis by software applications, such as Microsoft™ Excel™. As a complement to the diagnosis, the user may have access to various common digital and display processing tools, for example a graphical display of the temporal traces filtered or not, spectrograms and Wigner-Ville and time-frequency wavelet distributions. The user may also apply different digital filters and processings on the digital temporal traces and return to the statistical display of the latter (concept of iterative looping in the diagnosis).

Referring to FIG. 4, the apparatus comprises three probes 4, 6, 14 connected to a control unit (CU) 16 which is connected to the computer 1. The length of the probe connecting cables 19, 21, 23 is such that it allows placing the CU 16 and the computer 1 in a truck or other remote location whereas the probes 4, 6, 14 are mounted on the power cables 10 and the accessories 8 (FIGS. 1-3). The CU 16 may be housed inside the computer 1 for saving space and facilitating connections. However, the CU 16 may as well be located outside the computer 1 and be connected to it by means of an appropriate cable 29.

The purpose of two of the three probes, namely probes 4, 6, is to sense the electromagnetic pulse generated by a partial discharge, propagating in the accessories 8 and cables 10 (FIGS. 1-3). The purpose of the third probe 14 is to sense the power wave and, when desired, to inject a test signal.

The purpose of the CU 16 is mainly to allow synchronization of an acquisition window with the power wave, in defining the temporal beginning and end of the digitization in network phasor degrees. The other functions are the analog processing of the partial discharge signals (including voltage surge protection) and their transmission to the computer 1 in analog form (or digital form if desired), supplying power to the probes 4, 6 and controlling their gain, transmitting a test signal to the synchronization probe 14, validating that the accessory 8 is under voltage and diagnosing a defective probe 4, 6, 14.

The purpose of the computer 1 is to configure the CU 16, to digitize the signals, to apply a digital processing on the signals, to carry out the diagnosis, to display the measurements and the diagnosis as well as to save the tests in a database and exchanging the data with other systems.

The measurement method uses three probes, namely two magnetic coupling wideband probes 4, 6 sensing the partial discharges and a synchronization probe 14 sensing the 60 Hz wave for extracting the phase angle value from it. Both magnetic probes 4, 6 may be positioned on both sides of the accessory or at one of its ends. The synchronization probe 14 may be of a capacitive, magnetic, voltage or current measurement type. The synchronization probe 14 may be connected to the tested accessory 8 as illustrated in FIG. 2, or to another accessory (i.e. another phase), in which case the phase angle value is corrected by ±120° to take the interphase shift into account if necessary. The synchronization probe 14 may be combined to any or each one of the other probes 4, 6. It may then appear as a distinctive element in the housing of the combined probe or be integrated with the wideband part. In the latter case, a signal separation circuit allows extracting the low frequency signal (close to the network frequency) from the wideband signal.

Three calibration procedures are preferably carried out. In one of these procedures, the CU 16 injects a known signal in the digitizing module of the computer 1, which allows calibration of the response of the acquisition card(s) linked with the filters. In another one of the procedures, the CU 16 injects a known signal in the synchronization probe 14 installed on the accessory 8 to be tested in order to confirm the configuration of the probes 4, 6 and to calibrate the probe-to-probe propagation delay in the cable 10. In another procedure, the CU 16 injects a known signal in the synchronization probe 14 installed on a portable test bench (not shown) in order to calibrate the whole apparatus.

Figure 9:
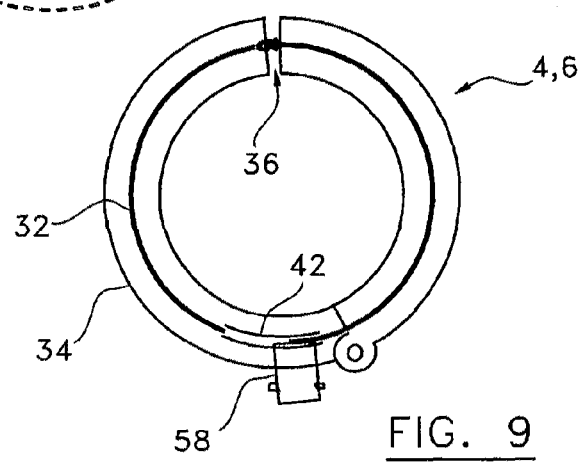

Given the low amplitude of the discharge signal and the length (several meters) of the connecting cables 19, 21, 23 of the probes 4, 6, 14, the wideband (many hundreds of megahertz) magnetic probes 4, 6 advantageously (but not compulsorily) house a controlled gain amplifier 42 (FIG. 9). The illustrated probes 4, 6 are especially designed to operate with power cables 10 having a neutral sheath 28 (FIGS. 5 and 6A) formed of strands. The probes 4, 6 measure the longitudinal magnetic field generated by the helix so formed. The measurement method still remains valid for other types of cables (for example, with a continuous smooth sheath in aluminum or lead) but possibly requires replacement of the magnetic probes 4, 6 by another type of wideband probe (for example, a capacitive probe).

The synchronization probe 14 is bidirectional since it is used both for sensing the phase of the 60 Hz wave and for injecting a test signal or a calibration signal in the cable 10. The probe 14 as illustrated in FIG. 2 measures the shunt current between two electrodes positioned for example using mounting clamps 25, 27, one on the semiconducting sheath 26 and the other one on the neutral 28. However, another type of sensing may well be used such as magnetic coupling, capacitive coupling or voltage measurement.

The CU 16 controlled by the computer 1 is able to achieve a) the analog conditioning and protection against voltage and current surges; b) the switching of analog filters 63; c) the synchronization of an acquisition over a targeted portion of the cycle (0-360 degrees) of the 60 Hz wave through a triggering signal transmitted to the acquisition card of the computer 1; d) the control of the gains of the wideband probes 4, 6 and their power supply; e) the transmission of a test signal to the synchronization probe 14 to inject this signal in the accessory 8; f) the transmission of a test signal to the computer 1; g) the diagnosis regarding the good working condition of the wideband probes 4, 6 and the transmission of this diagnosis to the computer 1; and h) the checking of presence of voltage on the accessory 8 and the transmission of this state to the computer 1.

Digitization is performed at a very high rate, namely between 1 giga and 10 giga samples per second for the signals of both wideband probes 4, 6.

In the digital analysis, many diagnosis possibilities are examined so that at certain occasions, the apparatus warns the user of a second probable diagnosis explanation in addition to that presented as the most probable one.

A signal interpolation is preferably achieved before the correlation.

A calculation of the time-frequency form factor, based on the ratio of bandwidth over time length, facilitates recognition of the real partial discharges.

Clusterization (or clustering) can be achieved on the acquired signals so as to group signals exhibiting similar characteristics or traits (noise, discharge, etc.) into respective clusters and produce signatures characterizing the signals in the clusters. The signatures may be obtained by working out the means of the signal data in the respective clusters or by other possible data manipulations or operations. Correlation and other processings can then be carried out on the signatures in order to increase the signal/noise ratio while decreasing the computation time since less data are thereby processed compared to the raw data of the acquired signals.

Table 1 below provides a list of the main elements of information and signals at the input of the apparatus and their source.

TABLE 1

User controls:

Adjustment of the clock and of the calendar
Selection of language
Test parameter and control
In test mode:

Description of the test (location, accessories . . .)
Configuration of the probes with respect to the accessories
Parameters of the measurement
Start/end of the measurement
Reject/accept the measurement
In analysis mode:

Parameters of the signal processing
Parameters of the display
Computer links:

Reception of measurements and diagnoses coming from other sites
Wideband magnetic probes, via the CU:

Propagation signal having a longitudinal magnetic component and sensed on the cable
Synchronization probe:

60 Hz power wave

Table 2 provides a list of the main elements of information at the output of the apparatus and their target.

TABLE 2

User:

Parameters of the completed test
Graphical plot of the temporal signal
Graphical plot of the filtered temporal signal
Diagnosis
Calculated delays
Portable computer:

Writing of the completed tests in a database on a mass memory (disk or other)
Computer links:

Transmission of measurements, tests, diagnoses and database elements.
Synchronization probe:

Injection of a test signal in a cable

Referring to FIGS. 5, 6A and 6B, the shielded cable 10 on which each wideband magnetic probe 4, 6 is installed is made of a central conductor 20 surrounded by a semi-conductive sheath 22, an insulating dielectric 24, a second semi-conductive sheath 26 and a twisted concentric neutral 28. The resultant of the strands of the conductor 20 and of the neutral 28, and the fact that the neutral 28 does not provide a perfect shielding, are such that a neutral-conductor electromagnetic propagation wave has a non-negligible axial magnetic component 30, as illustrated in FIG. 6B.

Figure 7:
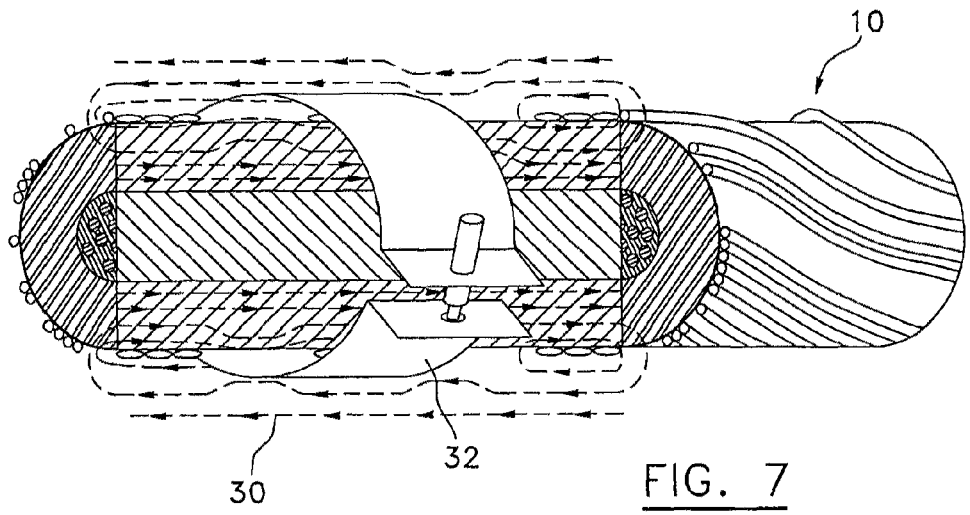
FIG. 7 is a schematic diagram illustrating field lines around the magnetic probe.

Referring to FIG. 7, each magnetic probe 4, 6, having a single conductive loop 32, senses the axial magnetic component 30 of the wave.

Figure 8:
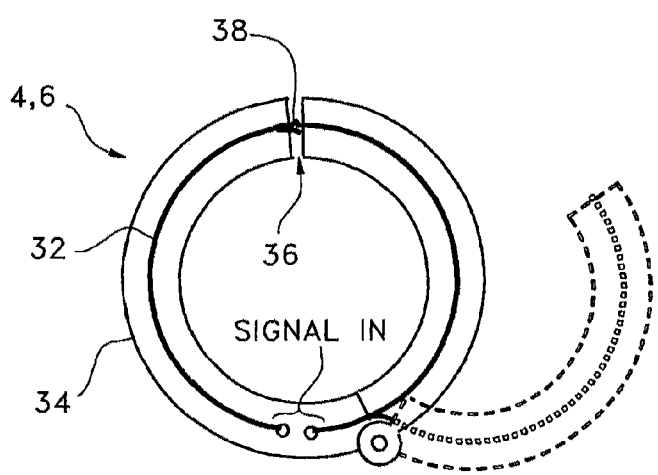
FIG. 8 and FIG. 9 are schematic diagrams illustrating a wideband magnetic probe without and with an amplifier circuit and an external connector.

Referring to FIG. 8, each wideband magnetic probe 4, 6 looks like a removable clamp made of a magnetic sensing conductive loop 32 covered with a conductive shield 34 also used as a housing for the probe 4, 6. One purpose of this shield is to electrostatically insulate the magnetic sensing loop 32. To prevent current conduction in the shield which would oppose a magnetic field against the axial magnetic flux, the shield is in open circuit at the ends of the clamp so that a gap 36 appears. A connector 38 is used to close the circuit of the magnetic loop 32 at the ends of the clamp, where the gap 36 is located. The conductive loop 32 senses the axial magnetic flux 30 while being not much sensitive to the tangential field 40 (FIG. 6) surrounding the cable 10 and to ambient electric fields.

Referring to FIG. 9, the magnetic sensing loop 32 is connected to an amplifier circuit 42 integrated in the shielded housing of the clamp 34.

Figure 10:
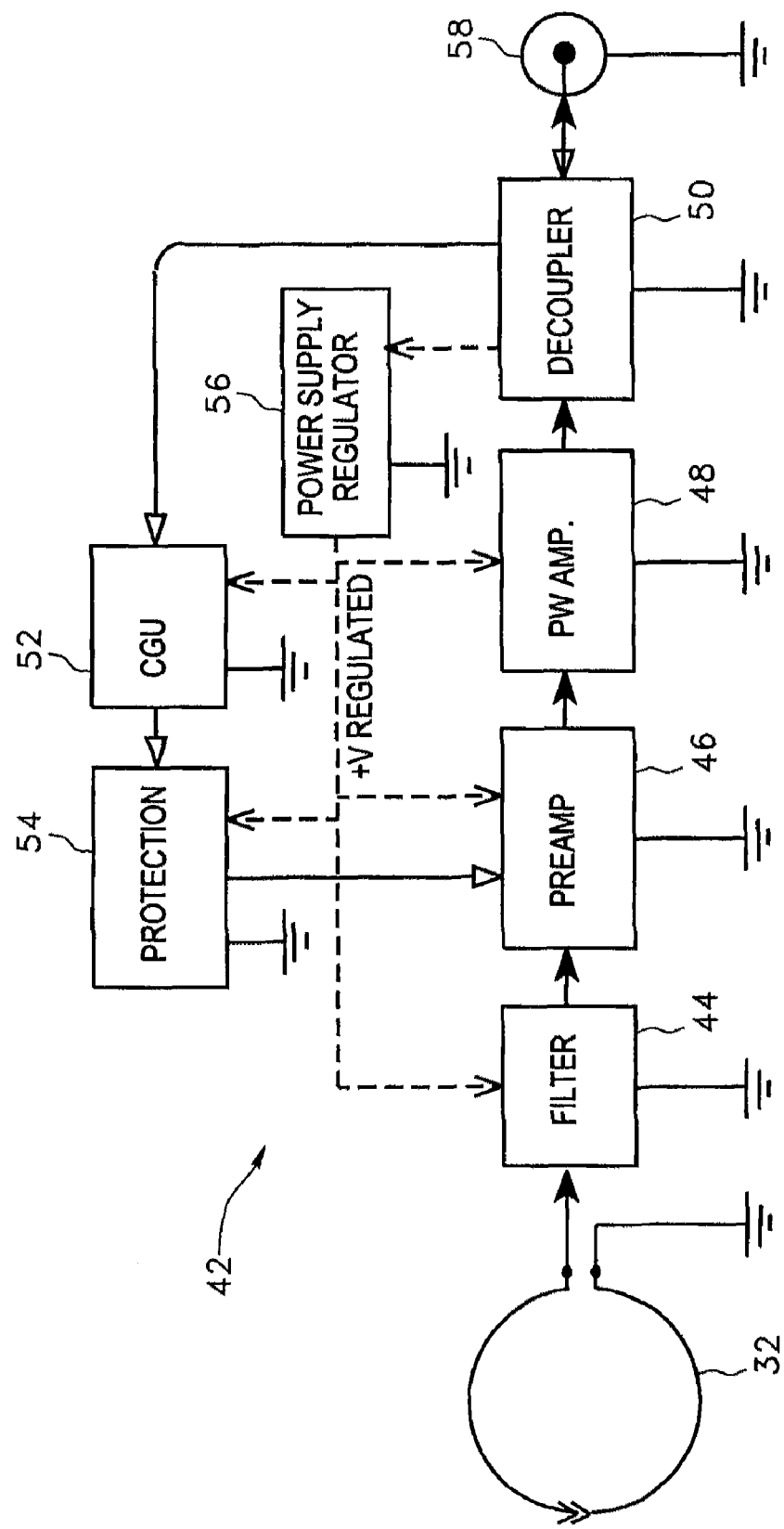
FIG. 10 is a schematic block diagram illustrating an amplifier circuit integrated in a wideband magnetic probe.

Referring to FIG. 10, the amplifier circuit 42 comprises a low-pass filter 44, a preamplifier 46, a power amplifier 48 also acting as an impedance matcher, a decoupler 50, a gain control unit (GCU) 52, a protection circuit 54 and a power supply regulator 56. The decoupler 50 allows the sensed signal to be transmitted via the connector 58, to provide the supply current to the regulator 56, and to transmit the gain control value received via the connector 58 to the GCU 52. The gain of the GCU 52 is adjustable as a function of the required sensitivity. The gain control comes from the CU 16 and is transmitted through the cable 19, 21 connected to the probe 4, 6 by the connector 58, this same cable 19, 21 transmitting the signal sensed and amplified by the probe 4, 6 to the CU 16 (see FIG. 4).

Figure 18:
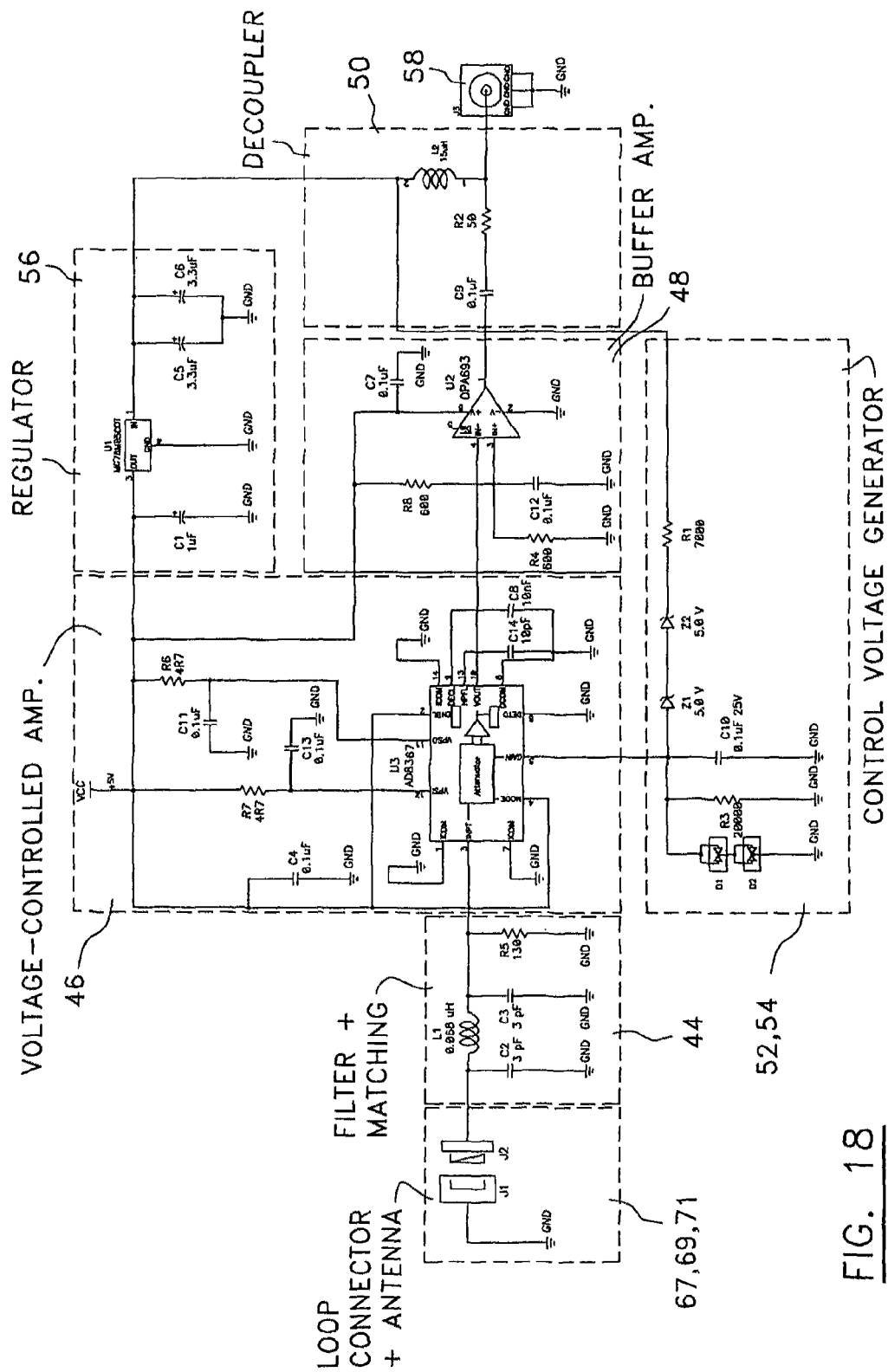
FIG. 18 is a schematic diagram illustrating a control unit of the apparatus.

FIG. 18 illustrates a possible diagram of the amplifier circuit 42 of a probe 4, 6.

Figure 19:
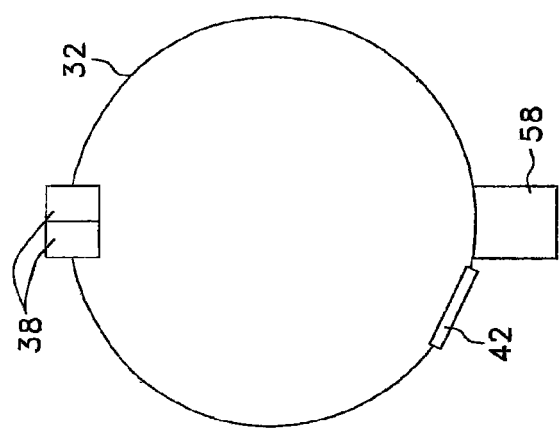
FIG. 19 and FIG. 20 are schematic diagrams in elevation and in plan view illustrating a construction of a wideband probe.
Figure 20:
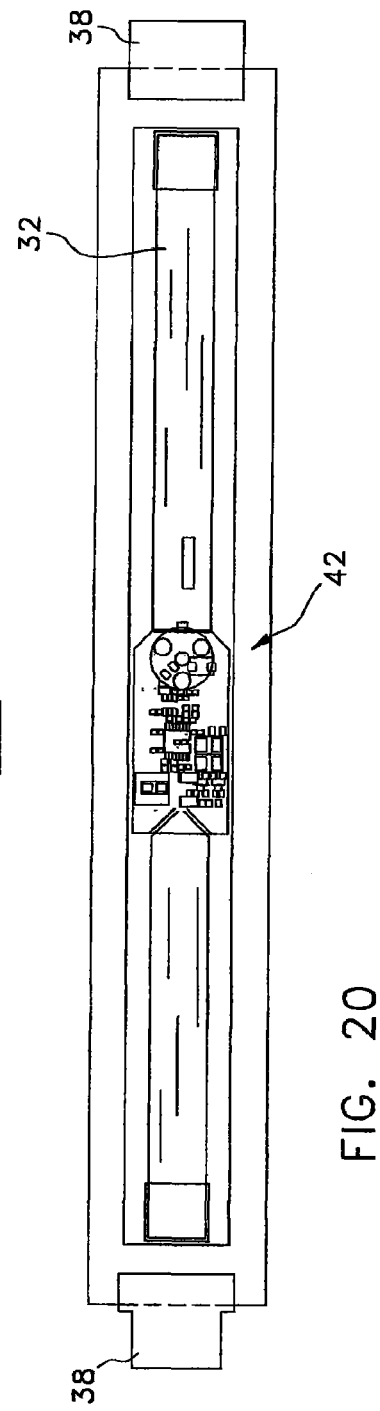

Referring to FIGS. 19 and 20, the magnetic sensing loop 32 may be made of a flexible printed circuit on which the amplifier circuit 42 and the connector 58 connectable to the cables 19, 21 are also located.

The cable connecting each wideband probe 4, 6 to the CU 16 may be of various natures. 50 ohms coaxial cables and double shielded 50 ohms coaxial cables may be used. This last type of cable is more expensive but it offers a better protection against noise. In fact, it is possible to use any type of cable providing a good immunity to electromagnetic noise and ground loop currents.

Figure 11:
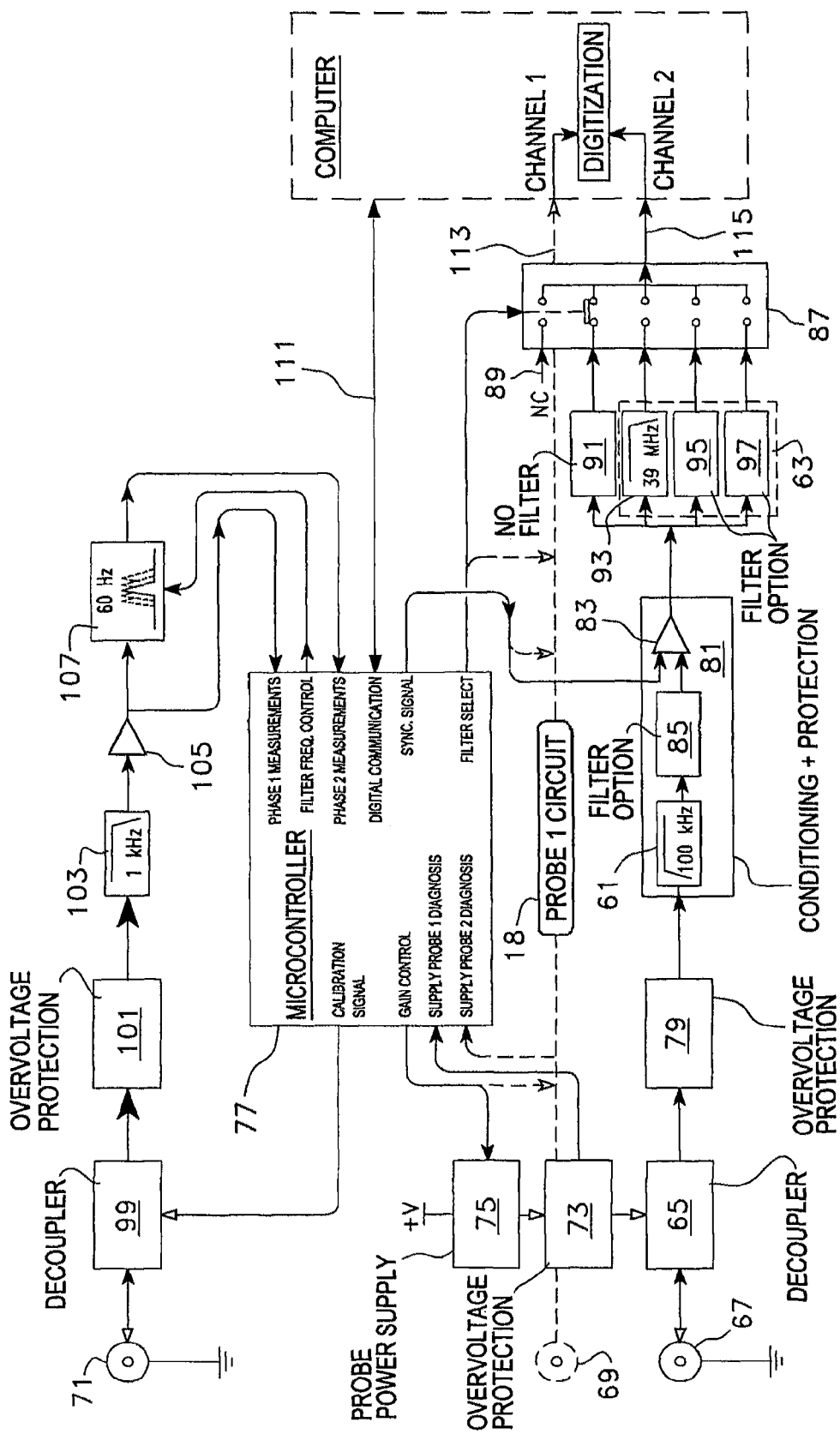
FIG. 11 is a schematic block diagram illustrating a control unit (CU) processing the signals from the probes.

Referring to FIG. 11, only the circuit processing the signal of the second probe 4 received on the connector 67 is illustrated. The circuit of the first probe 4, replaced by stipple lines 18, is identical to that of the second probe 6. The CU 16 controlled by the computer 1 comprises the analog conditioning of the signal of the wideband probes 4, 6, the protection against voltage surges on the probes 4, 6 and current surge on the power supply of the probes 4, 6. Connectors 69, 71 allow connecting the UC 16 to the measurement probe 4 and to the synchronization probe 14. A decoupling module 65 allows the separation between the signal coming from the probe 4 and the supply current. A current surge protection circuit 73 is positioned downstream from the power supply 75, this circuit 75 being connected to a microcontroller 77 so that the microcontroller 77 may detect the presence of the power supply of the probe 4. The current surge protection limits the supply current provided to each probe 4, 6 so that the probe 4, 6 and the power supply 75 are protected at once. The analog signal first passes through the voltage surge protection module 79. The purpose of the voltage surge protection is to maintain the signal within acceptable voltage limits to protect the probe 4 and the analog conditioning circuit 81. The analog conditioning 81 consists in the application of a high-pass filter 61 along with an amplification of the signal 83. The microcontroller 77 may inject a test signal, the synchronization signal or another required signal by means of the amplifier module 83. The cut-off frequency of the high-pass filter 61 may be between 30 kHz and 1.7 MHz (preferably 100 kHz). The purpose of this filter 61 is to eliminate noise coming from the electric network and radio broadcasts, mainly in the AM band. The conditioning circuit 81 preferably comprises a space reserved for the installation of a second optional filter stage 85 (high-pass, band-pass or low-pass) which would follow after the high-pass filter 61.

The CU 16 comprises a stage of switchable filters 63. In the illustrated circuit, a multiplexer 87 selects the signal transmitted to the computer 1. This signal may be absent (not connected) 89, the raw signal without passage through a filter 91, the signal filtered by a low-pass 93 (preferably set to around 39 MHz) or a selection among two other optional filters 95, 97.

The CU 16 allows synchronization of an acquisition over a target portion of the cycle (0-360 degree) of the power wave phasor (60 Hz or 50 Hz depending on the network). The synchronization signals are combined to the signal coming from the probe 4 in the conditioning amplifier 83. The resulting signal is transmitted to the acquisition card in the computer 1. The acquisition card then starts the detection of the discharges a bit prior to or at the showing of the first synchronization signal (the acquisition always takes place and the data are continuously recorded in a circular buffer) and stops the capture of the partial discharges after passage of the end of synchronization signal. An electronic synchronization circuit formed of a decoupler 99, a voltage surge protection circuit 101, a low-pass filter 103, an amplifier 105 and a band-pass filter 107 is controlled by the microcontroller 77 and is locked on the phase of the power wave in order to determine times corresponding to the start and the end of the detection range of the partial discharges. The decoupler 99 allows the transmission of a test signal to the synchronization probe 14 without this signal being transmitted to the rest of the circuit 101, 103, 105, 107. The signal coming from the synchronization probe 14 passes by the voltage surge protection module 101 to be then directed toward a low-pass filter 103, preferably set at 1 kHz, to reduce noise present in the signal. This filter 103 is followed by an amplifier 105 which supplies a narrow band-pass filter 107. The phase at the output of this filter 107 is compared to that of the input in order to control the frequency of the filter 107 for the purpose of preserving a 180 degrees phase-shift in spite of the frequency variations of the electric network. A counter (integrated in the microcontroller 77) controlled from the passages by zero of the signal at the output of the band-pass filter 107 provides an estimate of the phasor value except for a scale factor. The comparison of this last value with "start run" and "stop run" commands provides the generation time of the synchronization signals. Furthermore, in a preferred option, the partial discharge signal is communicated to the computer 1 only during the time period corresponding to this portion using the multiplexer 87.

Across a same wire 19, 21 (FIG. 4), the CU 16 transmits the gain control signal and the supply current required by the wideband probes 4, 6. The power supply module 75 controlled by the microcontroller 77 adjusts the voltage level corresponding to the required gain. The current surge module 73 monitors the power supply module 75 and transmits the supply state to the microcontroller 77. Finally, the decoupler module 65 insulates the supply current from the other signal conditioning circuits of the probe 4, 6.

The microcontroller 77 allows the transmission of a test signal to the synchronization probe 14 for injection of this signal in the accessory 8. The microcontroller 77 has a circuit that may generate a calibrated pulse of very short length, similar to the typical length of a partial discharge, or a pulse train having a delay pattern optimizing the correlation 64. After passage of the pulse in an amplifier (not shown in the Figures), the decoupler 99 directs it in the cable 23 (FIG. 4) connected to the synchronization probe 14. The low-pass filter 103 located at the input of the synchronization circuit insulates it in order to block the high amplitude pulse.

The CU 16 also allows the transmission of a test signal to the computer 1. An option resides in replacing one of the optional filters 93, 95 by a voltage source. Then, the multiplexer 63 simply has to be controlled in order to select this signal for transmitting it to the computer 1.

The CU 16 allows a diagnosis regarding the good working condition of the wideband probes 4, 6 and transmission of this diagnosis to the computer 1. When the protection system 73 of one of the probes 4, 6 is solicited, the microcontroller 77 is informed of it and then warns the computer 1 of the presence of a fault through a digital communication link 111.

The CU 16 allows the checking of the presence of voltage on the accessory 8 and transmission of this condition to the computer 1. In the absence of appropriate voltage, or when the synchronization probe 14 is not connected, the synchronization circuit 99, 101, 103, 105, 107 cannot operate normally. The microcontroller 77 then warns the computer 1 of it through the digital communication 111.

Figure 12:
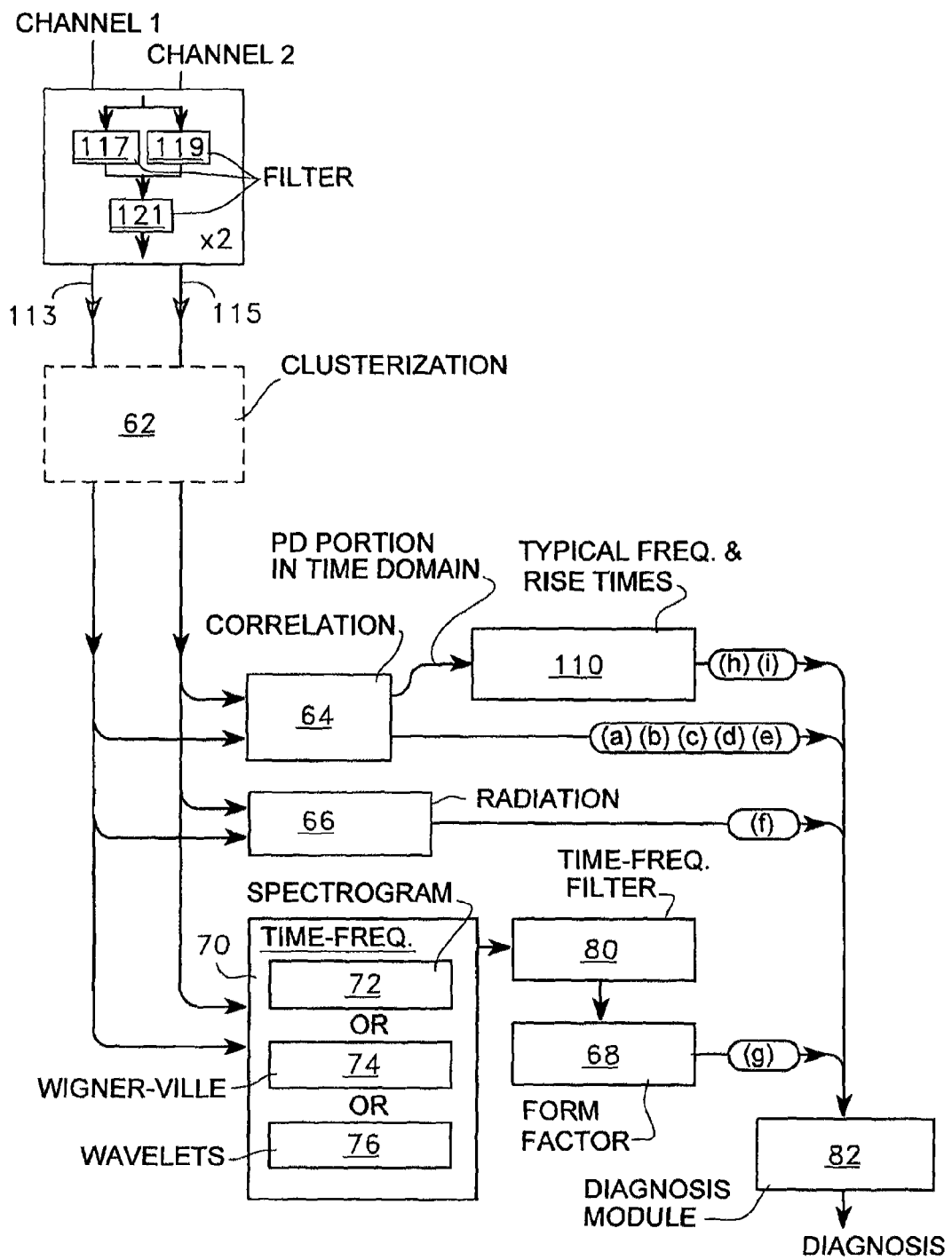
FIG. 12 is a schematic block diagram illustrating the main elements involved in the signal processing.

Referring to FIG. 12, there is illustrated a possible signal processing sequence performed by the apparatus to establish a diagnosis. Temporal correlations 64 may be used to determine the polarity of the discharges, the temporal distance $\Delta t$ between a same discharge sensed by both probes 4, 6, the "gamma" correlation coefficient, the diagnosis error probability, and the presence of another plausible diagnosis possibility.

A dedicated digital algorithm 66 assesses the possibility of the prevailing presence of radiation by calculating the number of oscillations in the portion of the sensed wave which exceeds the level of local noise. The presence of a high number of oscillations, namely more than 8 to 15 cycles, is a typical symptom of radiation. The calculation of the number of oscillation cycles may be achieved on one or both channels 113, 115. The processing stops when radiation (f) is detected. Another algorithm 68 calculates the form factor (g) over the channel exhibiting the highest discharge amplitude. This form factor (g) corresponds to the ratio of the spectral bandwidth over the time length of the discharge pulse. These last two values are respectively estimated from the prevailing spectral line and from the temporal marginal of the partial discharge represented in a time-frequency distribution 70. This time-frequency distribution 70 may correspond to a spectrogram 72, a Wigner-Ville transform 74 or to a wavelet transform 76 of the signal. The time-frequency distribution 70 may first be subjected to a time-frequency filtering 80 prior to calculation of the form factor (g) to remove the background noise exhibiting a substantially constant spectral power in the time domain. The temporal portion of the signal of the highest amplitude discharge is transmitted to a module 110 that estimates the equivalent bandwidth (h) and the rise time (i) of the discharge. The results (a) to (i) of the various applied processings form as many potential symptoms that are submitted to the user for letting him/her deduce a diagnosis, or submitted to a diagnosis algorithm 82.

The algorithm of the diagnosis module 82 may, for example, use hard-wired logic ("and", "or", threshold overrun), neural networks, an expert system, fuzzy logic, a genetic algorithm or a combination thereof to process the raw temporal signals and/or the results of the previously described processings.

The probes 4, 6 are AC coupled, meaning that the DC voltage is not measured. However, the digital converters may well exhibit a null offset. Furthermore, the RF signal of longer period than the duration of the digitization introduces a DC-like offset to which a slope and a parabola are added. These slow variations of the signal should preferably be suppressed prior to the processing by correlation 64, and even prior to the calculation of an interpolation. Two types of switchable high-pass filters 117, 119 arranged in parallel achieve this function. The first filter 117 achieves, with the signal, the convolution of a spectral window to then subtract this result from the signal. The other filter 119 is similar to a 0 Hz notch filter. This filter 119 convolutes a distribution obtained from the reverse Fourier transform of a unitary pulse over the full spectral band to which a spectral window set at 0 Hz has been subtracted. In this filter 119, the width of the cut-off window as well as the signal rejection level in the stopband may be adjusted. These filters 117, 119 eliminate the AM band radio signal.

A FM-TV filter 121 may be connected in series after the high-pass filters 117, 119. This filter 121 is also of convolutional type with a filter function consisting of a reverse Fourier transform of a stopband pattern adjusted, according to the request, on the various FM and TV bands. It is also possible to choose the rejection of the FM band, of the FM and TV bands for the channels from 2 to 4, or yet of the FM and TV bands for the channels 2 to 4 in addition to the channels 5 to 13. The other filter parameters are the filter order, the rejection level of the stopband and the frequency smoothing of the filter pattern.

The correlation consists in achieving (4) the sum of the crossed products of two functions such as:

$$\mathrm{Corr}(\tau) = \sum_n x(t_n) \cdot y(t_n - \tau), \text{ with } \tau = nT \text{ and } n \in Z \quad (1)$$

T being the sampling period. The sum applies where samples of x(t) and y(t−τ) exist. For a given value of t, when x(t) and y(t−τ), or yet x(t) and −y(t−τ), show a similarity, the correlation value reaches a maximum. Let us recall that the signal is digitized and quantized: a same waveform digitized with a small delay exhibits a different aspect. This remark has a direct relation with the fact that: the position of the correlation peak is defined temporally close to a half sampling period; the amplitude of the real correlation peak may be substantially different from the examined peak. The drawbacks of the quantization are minor when the signal is highly oversampled. Conversely, for a wideband type of signal, interpolation of the signal prior to correlation is preferable to minimize these effects. Here, interpolation increases the number of samples from 2 to 5 times. The interpolation function used is the product of the sinc( ) function by a spectral window (e.g. Blackman-Harris), but another interpolator may very well be used.

Clusterization depicted by module 62 can be achieved on the acquired signals so as to group signals having similar characteristics or traits into respective clusters and produce signatures characterizing the signals in the clusters as aforesaid. The subsequent processings may then be carried out on the signatures, resulting in a greater signal-to-noise ratio and a faster processing as the number of data to be processed is reduced.

Figure 13:
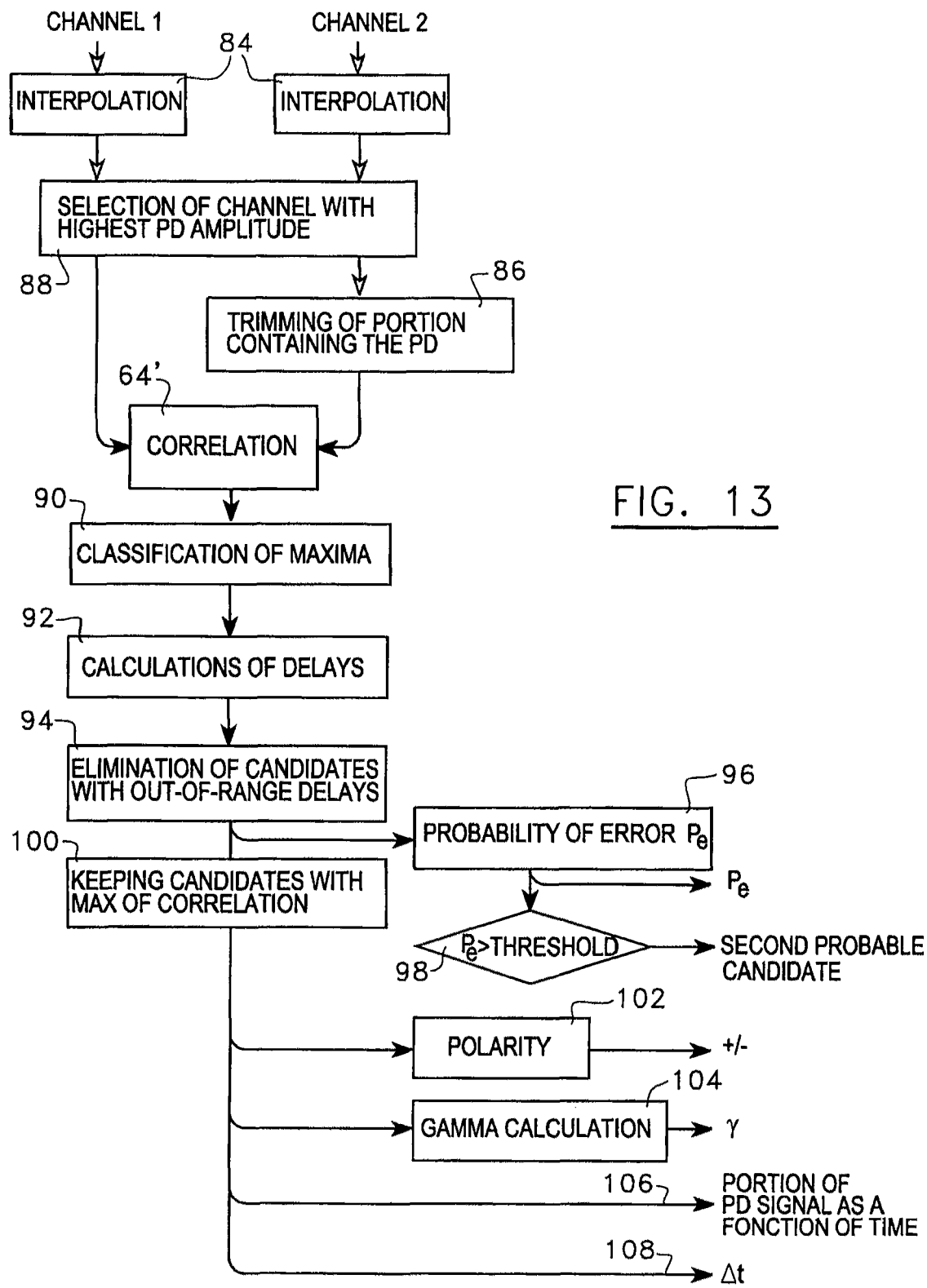
FIG. 13 is a schematic block diagram illustrating the use of correlation as a digital processing tool.

Referring to FIG. 13, there is shown a schematic block diagram providing details of the correlation module 64 illustrated in FIG. 12. An interpolation 84 takes place prior to a correlation 64'. Prior to correlation 64', on one of the channels, the temporal width of correlation is reduced to the required minimum 86 in order to increase the signal/noise ratio. This required minimum corresponds to the portion of the signal where it seems to emerge from the noise of a partial discharge. It is the channel exhibiting the highest amplitude discharge signal that is selected for this decoupling 88. This ensures that the start and the end of the discharge will be defined more acutely.

The result of the correlation 64' is a set of positive and negative peaks. A simple classification in absolute value of amplitude allows keeping the main peaks 90. In the delay calculation module 92, for each correlation peak, the value of the corresponding variable τ is multiplied by the constant required to obtain the delay Δt between both observations of the discharge. This delay is used by a module 94 which eliminates false discharges, namely those which exhibit a delay exceeding the propagation time between both probes 4, 6. The propagation time may be estimated during calibration at the beginning of the test. Another module 96 estimates the probability of diagnosis error based on how much the maximum correlation peak stands out against the other peaks. When the error probability exceeds a preset threshold 98, a warning of the existence of a second probable candidate of diagnostic explanation is transmitted.

Finally, the data concerning the maximum correlation peak are kept 100 and transmitted to the polarity estimation module 102 as well as to the correlation coefficient γ calculation module 104. This last coefficient:

$$\gamma = \frac{\sum_n x(t_n) \cdot y(t_n - \tau)}{\sqrt{\sum_n x(t_n)^2 \cdot \sum_n y(t_n - \tau)^2}} \quad (2)$$

provides an assessment of the similarity between the two compared discharge signals.

The correlation module 64 also provides the value of the channel-to-channel delay Δt 106 of the partial discharge as well as the temporal trace portion of the highest amplitude discharge 108.

The calibration of the propagation delay between the wideband probes 4, 6 is usually carried out at the start of a diagnosis test. Following the injection of the test signal in the synchronization probe 14, the response sensed by each wideband probe 4, 6 is analyzed to estimate the propagation delay between these two probes 4, 6. To this effect, a phase and amplitude correction filter (not shown as such, but embodied by the computer 1) reshape the signal detected by the probe located on the farthest side from the synchronization probe 14 (for example in FIG. 2 it will be the signal from the first probe 4). The reshaping is intended to correct the distortion that the propagation wave has sustained in its passage across the accessory 8. The reshaping of the signal from the other probe is optional. Afterwards, the propagation delays are estimated by correlation with the signal injected by the synchronization probe 14. This last correlation uses the elements 84, 86, 88, 64, 90, 100 and 102 illustrated in FIG. 13. The polarity of the signal confirms the test configuration. For example, for the diagram in FIG. 2, the polarity must appear reversed otherwise one of the sensor 4, 6 is inverted from the other sensor.

The sum of both delay estimations provides an estimate of the propagation delay between both wideband probes 4, 6 for the diagrams in FIGS. 1 and 2. For the configuration illustrated in FIG. 3, the difference between both delay estimations is used. The response sensed by the wideband probes 4, 6 derived from the test signal may thus also be used to check the configuration of the probes 4, 6 as a function of the polarity of the acquired signals.

The partial discharges are characterized by a short duration wideband pulse. The form factor 68 is informative as to what extent the digitized event conforms to that last characteristic. The form factor 28 is derived from the spectrogram $X_{i,m}$ 72 filtered in time-frequency of the signal $x_n$. This factor is defined as the moment of inertia in the spectral domain over the moment of inertia in the time domain such as $$F = \frac{\sum_i X_{i,m_s} \cdot (i-c)^2}{\sum_m \hat{x}_m \cdot (m-m_s)^2} \quad (3)$$

where $X_{i,m_s}$ is the Fourier transform corresponding to the time slot $m_s$ coinciding with the maximum amplitude of the discharge, $\hat{x}_m$ is the time marginal with m as time slot index of the spectrogram such as $$\hat{x}_m = \sum_i X_{i,m},$$

c is either equal to zero or equal to the gravity center of $X_i$ such as $$c = \sum_i X_i \cdot i \bigg/ \sum_i X_i.$$

Figure 14:
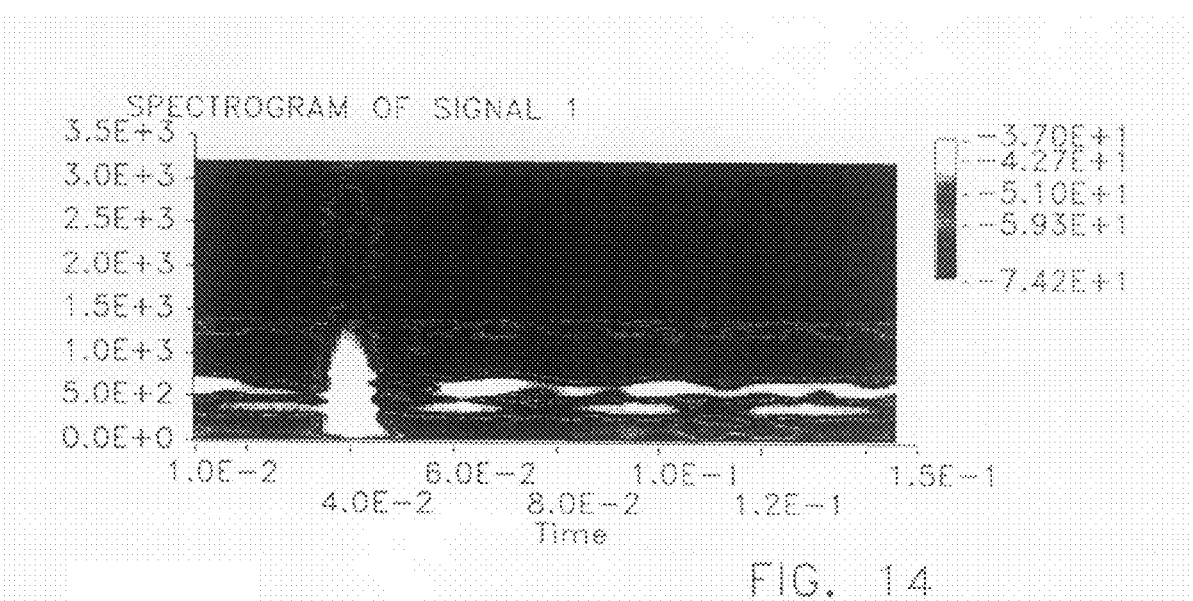
FIG. 14 is a schematic diagram illustrating a spectrogram of a partial discharge that may be used in accordance with an embodiment of the system described herein.
Figure 15:
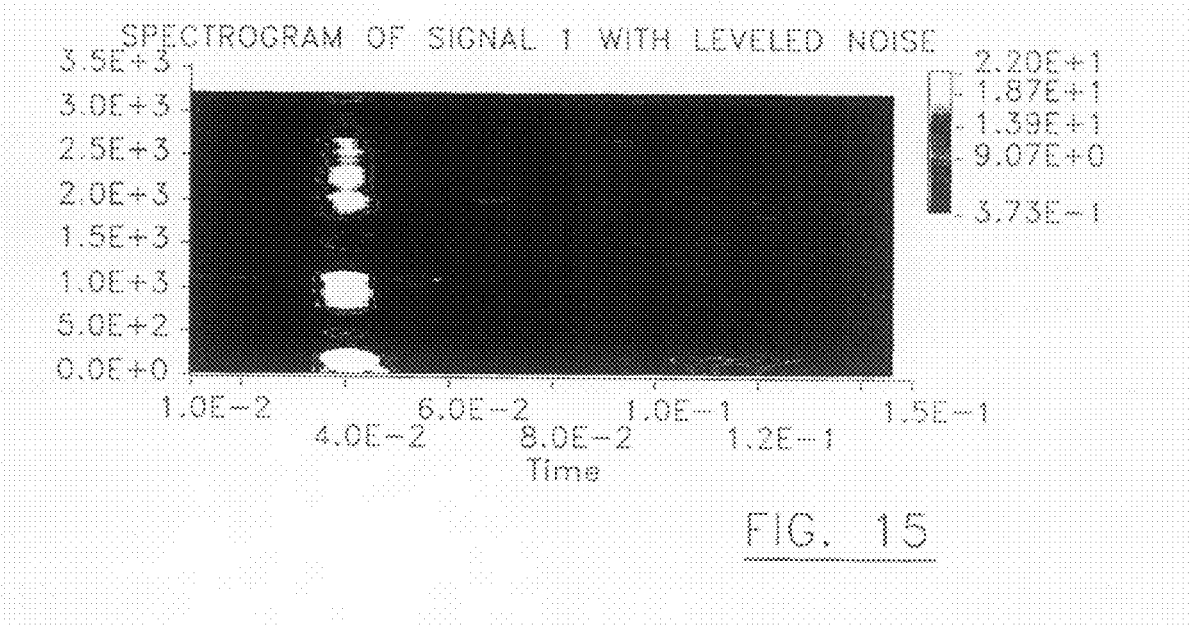
FIG. 15 is a picture illustrating a spectrogram of a partial discharge after application of a time frequency filter that may be used in accordance with an embodiment of the system described herein.

FIG. 14 illustrates a spectrogram $X_{i,m}$ such as i is the frequency index and m is the time index, whereas FIG. 15 provides the filtered result. In FIG. 14, time is in x-axis whereas frequency is in y-axis (the shown values are not to scale). The 3 horizontal rippled lines correspond to undesired radio modulations. In FIG. 15, the 3 radio modulation signals appearing in FIG. 14 have been eliminated.

The filter function writes as:

$$Y_{i,m} = \begin{cases} \exp(\log(X_{i,m}) - (S_i + \chi)) & \text{when } \log(X_{i,m}) \geq (S_i + \chi) \\ 1 & \text{when } \log(X_{i,m}) < (S_i + \chi) \end{cases} \quad (4)$$

with $$S_i = \frac{\sum_k \log(X_{i,k})}{\sum_k 1} \quad (5)$$

where $k \in \left\{ n \,\bigg|\, \sum_i \log(X_{i,m}) \leq \text{Marginal threshold in time domain} \right\}$.

As a function of the duration of the digitization and the duration of a typical discharge, the marginal threshold in the time domain is adjusted to obtain the fraction of the time slots in which noise is mainly observed. It is thus preferable to have digitized data before occurrence of the discharge in order to have a measurement of noise. In the algorithm, the adjustment of the marginal threshold is achieved by trial and error by reducing the search range by a factor of two at each trial. For each tested threshold value, there is obtained a ratio of time slots below this threshold. The iterative adjustment stops when the obtained ratio is close to the one required.

Thus, $S_i$ provides a plausible estimate of the mean spectral density of noise (in dB) during the discharge. The constant $\chi$ is expressed in decibel and allows keeping only the signal emerging of $\chi$ decibels from noise. The result is an adapted noise levelling at each spectral line.

The same algorithm can be applied on the spectral amplitude or power rather than on the logarithm of $X_{i,m}$ (i.e. log(*) is replaced by * and exp(*) by *). However, the version using the logarithm is much more efficient.

The signals of close partial discharges are characterized by higher amplitude lobe followed by a small number of highly damped oscillations. There sometimes appears a half-cycle of oscillation prior to the higher amplitude lobe: this pre-peak oscillation has a low amplitude and is not considered. The rise time is thus defined as being the passage from 5% to 95% of the rise of the higher amplitude lobe. From the portion of the signal containing the higher amplitude discharge, the module 110 (FIG. 12) applies a Fourier transform and estimates the typical frequency (or characteristic frequency) of the discharge. A particularity of the digital processing is that there is spectral interpolation by addition of zeros on both sides of the signal in time domain before application of the Fourier transform. The inverse of the typical frequency, multiplied by a calibration coefficient, provides an estimate of the rise time. The advantage of this calculation is that it is based on the whole of the points of the discharge signal in the time domain: the result is thus stronger to noise.

Figure 21:
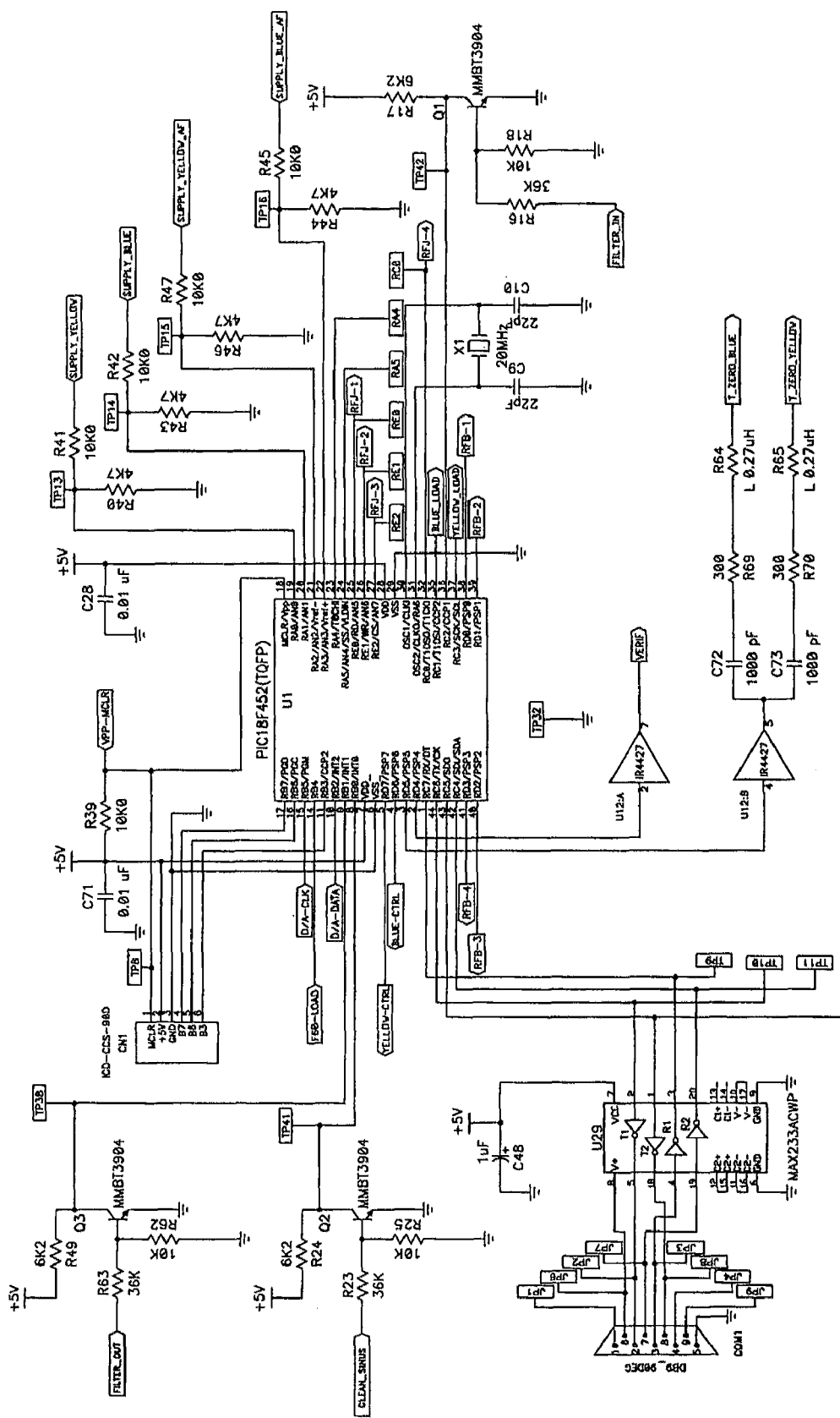
FIG. 21 is a schematic diagram illustrating the microcontroller circuit of a control unit.

Referring to FIGS. 21 to 27, there are shown possible schematic diagrams of the electronics of the CU 16. FIG. 21 more specifically relates to the circuit of the microcontroller 77. The channels for the wideband probes are respectively attributed the names "yellow channel" and "blue channel". There is seen in the Figure that there are two power supply measurements for these two channels (pins 19 to 22 of U1): a voltage measurement upstream of the fuse and a measurement downstream of the fuse. These measurements allow detecting a malfunction of one of the probes 4, 6. The circuit also comprises a connector CN1 for programming purposes and another connector COM1 for RS-232 communications. One of the analog outputs (pin 3) of the microcontroller (U1) is used to inject a test signal in the wideband probes 4, 6 while the other (pin 2) is used to inject a test signal in the synchronization probe 14.

Figure 22:
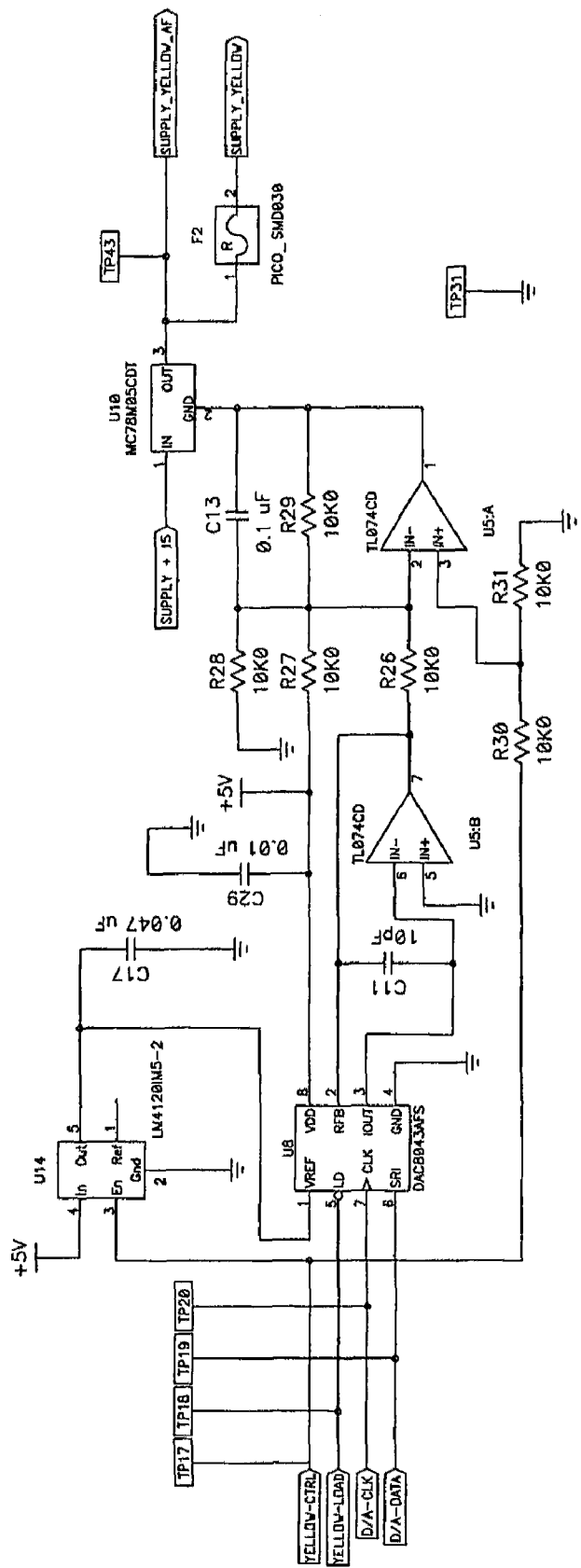
FIG. 22 and FIG. 23 are schematic diagrams illustrating the power supply circuits of the wideband probes.
Figure 23:
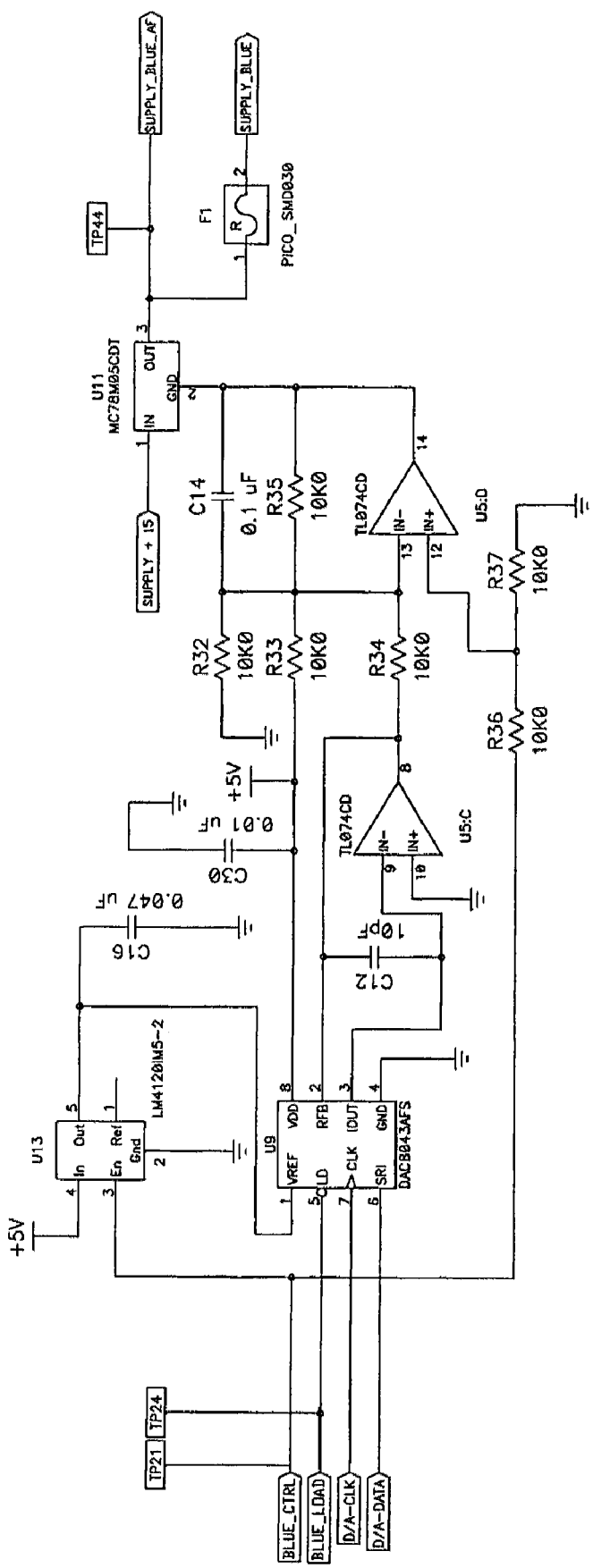

FIGS. 22 and 23 illustrate power supplies for the wideband probes 4, 6. The output of a power supply simultaneously contains the required current for operation of the electronics of the probe 4, 6 and the signal indicating the controlled gain to the electronics of the probe 4, 6. This signal containing the gain control is a voltage superimposed on the supply voltage, voltage which is controlled by the microcontroller U1. The circuit of a power supply is thus formed of a reference voltage source (U14/U13), a digital/analog converter (U8/U9), a voltage adder (U5) and a voltage regulator (U10/U11).

Figure 24:
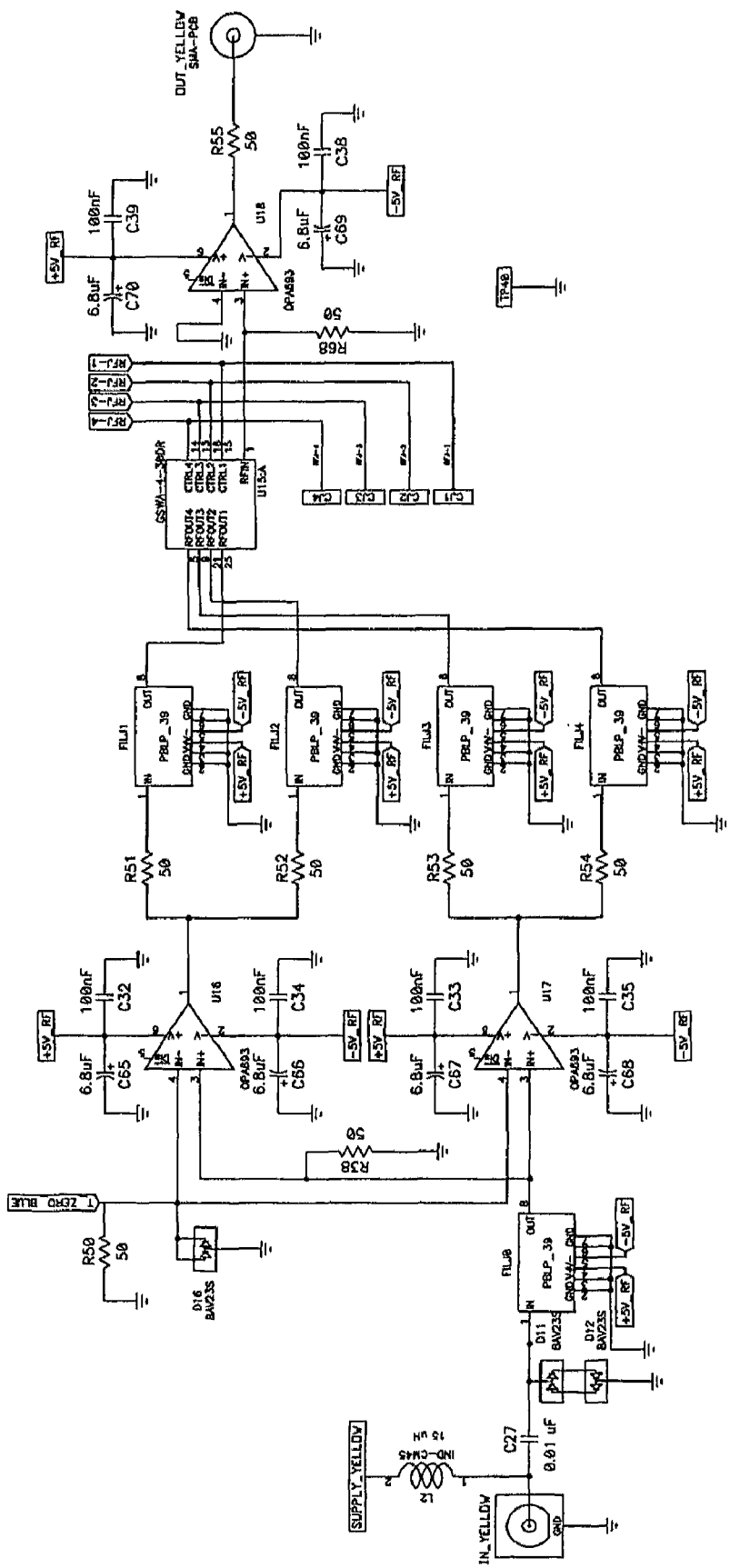
FIG. 24 and FIG. 25 are schematic diagrams illustrating the signal amplifier and conditioning wideband (RF) circuits of the wideband probes.
Figure 25:
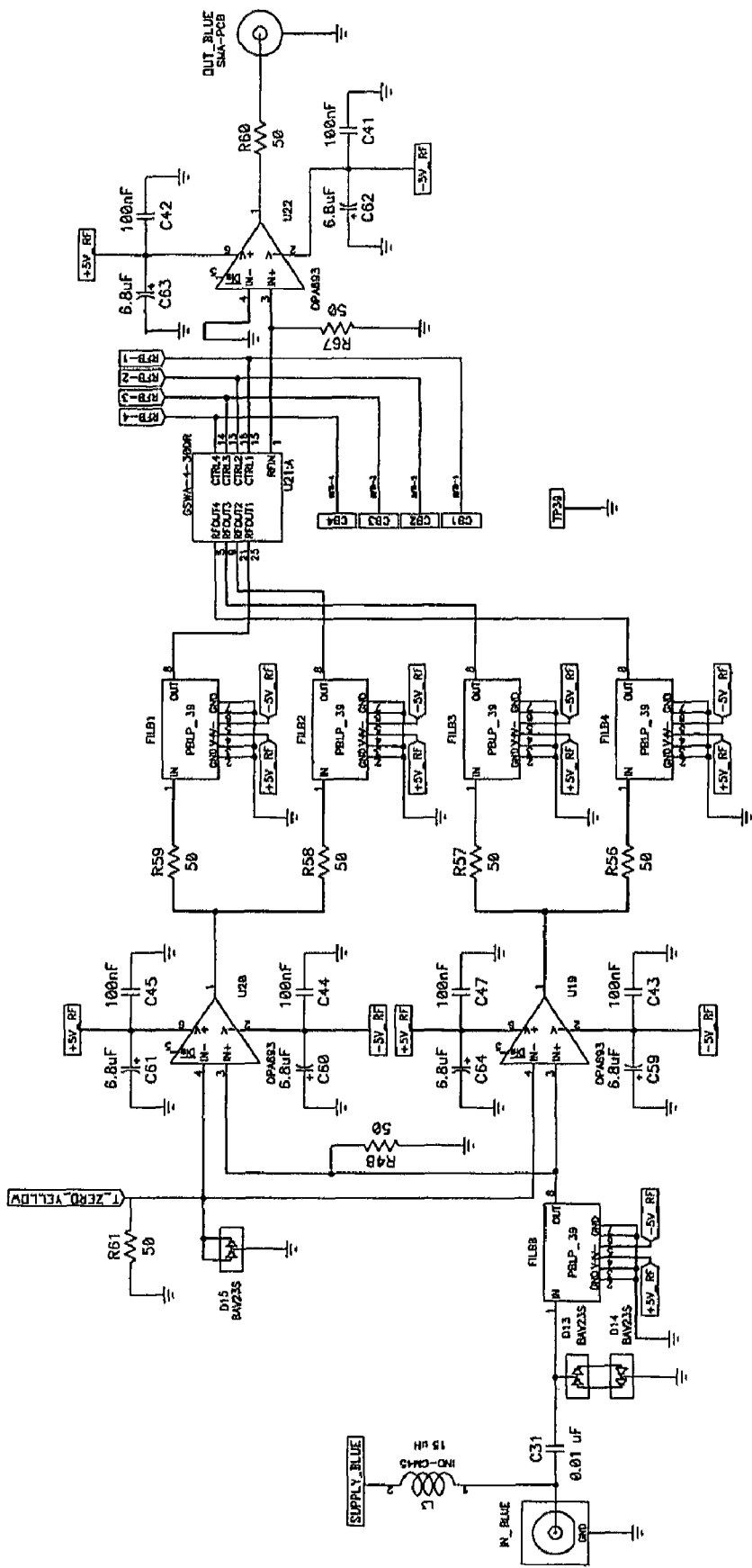

FIGS. 24 and 25 illustrate schematic diagrams of the amplifier and conditioning wideband circuits (i.e. RF) of the signals from the wideband probes 4, 6. On the left hand side, there is seen the presence of the injection of the power supply signal of the probe 4, 6 through an inductor (L2/L3) and the presence of a RF coupling capacitor (C27/C31). The purpose of these two components is to decouple the power supply circuit from the amplifier circuit. This signal and supply shunt filter is followed by a protection and by a high-pass filter (PBLP_39), itself followed by an impedance matching stage (U16, U17/U20, U19) and by filters (PBLP_39) arranged in parallel and switchable. The switching is controlled by the microcontroller (U1) via 4 bits. On the upper left hand side, there is shown an input for the injection of the test signal for the "zero". A last amplifier stage (U18/U22) transmits the processed signal in a 50 Ohms line.

Figure 26:
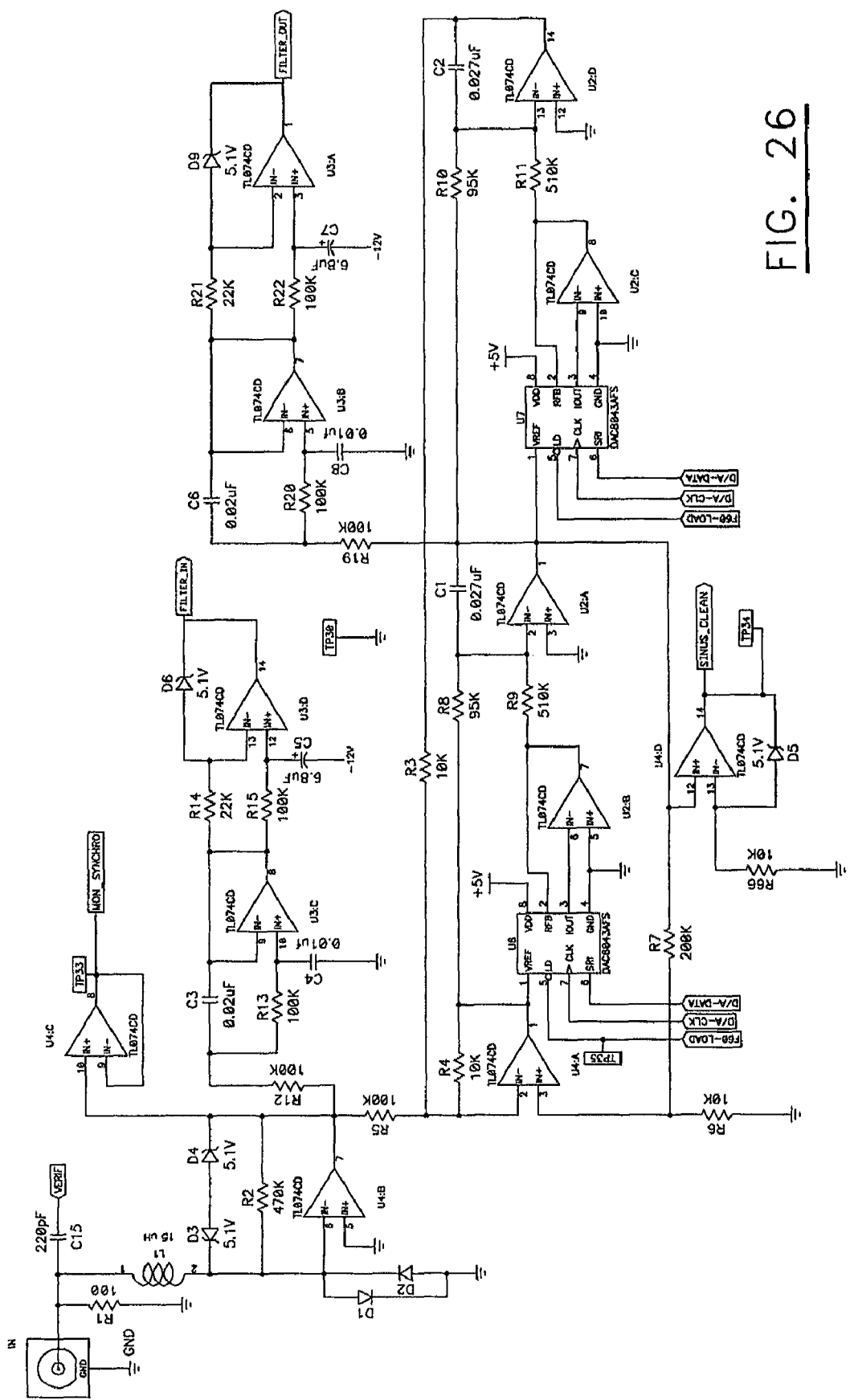
FIG. 26 is a schematic diagram illustrating a signal conditioning circuit of a synchronization probe.

FIG. 26 illustrates the conditioning of the signal of the synchronization probe 14. The circuit begins on the right hand side with a shunt filter (C15) between the test signal (RF) transmitted to the probe and the signal coming from the probe (60 Hz). This last signal, after passage in an inductor (L1), is clipped close to the passages by zero. The signal so clipped is directed in a low pass filter and a narrow band pass follower filter. This last filter is connected to a low pass filter identical to the first low pass filter in order to preserve the same delay. These signals filtered by the low pass filters are transmitted to the microcontroller (U1) that controls the response of the band pass filter so that a 360 degrees phase shift is observed between the outputs of the two low pass filters. A last amplifier circuit shown at the bottom of the Figure provides the microcontroller (U1) with the sinusoidal signal filtered and in phase with that of the synchronization probe 14. This signal is used by the microcontroller (U1) to estimate the 60 Hz phase as a function of time.

Figure 27:
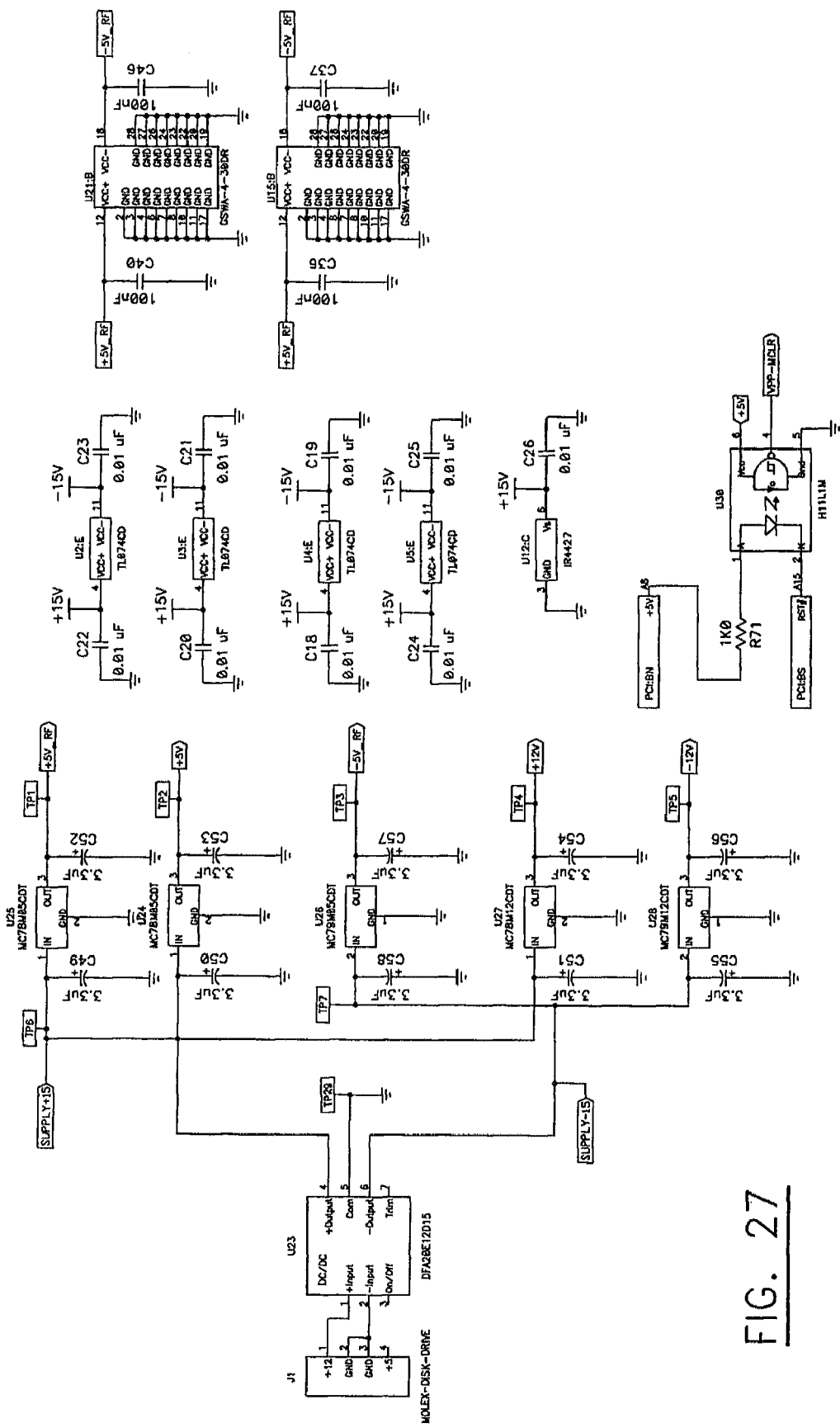
FIG. 27 is a schematic diagram illustrating power supply circuits of the other circuits of the control unit.

FIG. 27 shows the various power supply circuits of the circuits of the control unit 16.

Referring to FIGS. 4 and 12, a scaled down version of the apparatus may be used to quickly check if an electrical equipment is plagued with partial discharges, and thus requires further testing with the more sophisticated version of the apparatus or should be approached with caution. The scaled-down version of the apparatus may have only one measurement probe 4 (or 6) instead of two, and the digital processing unit 1 may be reduced to the clusterization module 62, the module 70 for performing a time-frequency distribution (of the clusterized signals), the form factor estimating module 68, the module 110 for determining rise times (of the clusterized signals), and the diagnosis module 82 which in that case is responsive to results generated by the form factor estimating module 68 and the module 110 for determining rise times, and produces a warning signal as a function of the diagnosis to report the detection of partial discharges if necessary. All the electronics of the digital processing unit 1 and of the control unit 16 related to the second measurement channel (when two measurement probes are used) may thus be omitted. Preferably, in the scaled down version, the calibration probe 14 will be such that it does not require any contact with the equipment to be tested to provide an indication of the phase angle in the equipment. Depending on the type of probe 14 used in this respect, it may be necessary to appraise the phase angle based on a signal indicative of the phase angle detected by the probe 14 (for example, a measurement of current). As the phase angle is mainly used for timing and tracking purposes in the scaled down version of the apparatus, it will be unimportant if the appraised phase angle does not coincide with the real phase angle in the equipment provided that the phase error remains approximately constant. Preferably, phase resolved information is used to match clusters of opposite polarity discharges. For diagnostic purposes, probability of discharge presence is increasing with the existence of two clusters of opposite polarities.

While embodiments of the invention have been illustrated in the accompanying drawings and described above, it will be evident to those skilled in the art that changes and modifications may be made therein without departing from the essence of this invention.

The invention claimed is:

1. An apparatus for detecting, localizing and interpreting a partial discharge occurring in a partial discharge site along an electrical equipment, comprising:
   two measurement probes and a synchronization probe installable along the electrical equipment so that pulses travelling in the electrical equipment are detectable by the measurement probes and a phase angle in the electrical equipment is detectable by the synchronization probe;
   a control unit connecting to the measurement probes for receiving signals representative of the detected pulses, and connecting to the synchronization probe for acquiring a signal representative of the detected phase angle, the control unit having a circuit for selective conditioning of the received signals; and
   a digital processing unit connecting to the control unit for acquiring the signals after selective conditioning as a function of the detected phase angle and driving the control unit, the digital processing unit having a correlation measuring module for measuring correlation of the acquired signals, a module for performing a time-frequency distribution of at least one of the acquired signals, a form factor estimating module for estimating a form factor corresponding to a ratio of a spectral bandwidth over a time length of a discharge pulse derived from the time-frequency distribution, and a diagnosis module configured for interpretation of the correlation and the form factor for generating a diagnosis indicative of a detection of a partial discharge and of a localization of the partial discharge along the electrical equipment based on the interpretation.

2. The apparatus according to claim 1, wherein the processing unit further comprises a candidate eliminating module eliminating candidates of diagnosis solutions corresponding to traces in the acquired signals derived from detected pulses having out-of-range propagation delays between the measurement probes.

3. The apparatus according to claim 2, wherein a threshold for delays considered being out-of-range by the candidate eliminating module is settable by a user.

4. The apparatus according to claim 2, wherein the control unit comprises a circuit for generating a test signal transmitted to the synchronization probe that injects the test signal in the electrical equipment, the digital processing unit being apt, from the acquired signals corresponding to pulses detected by the measurement probes caused by the test signal injected in the electrical equipment, to determine the propagation delay between the measurement probes, a threshold for delays considered to be out-of-range being set as a function of the propagation delay so determined.

5. The apparatus according to claim 1, wherein the processing unit further comprises a module for estimating a probability of error as a function of a ratio between a peak of a maximum of correlation among other correlation peaks, a warning signal indicative of a multiple probable candidates of diagnosis explanation being transmitted to the diagnosis module when the probability of error exceeds a preset threshold.

6. The apparatus according to claim 1, wherein the processing unit further comprises a module for detecting typical traces of radiation in the acquired signals, the processing being stopped and a radiation diagnosis being retained when a determination is made that the acquired signals correspond to radiation.

7. The apparatus according to claim 1, wherein the correlation measuring module provides the diagnosis module with a signal indicative of the polarities of the pulses in the acquired signals, a correlation factor of the correlated signals, a temporal trace portion of a higher amplitude discharge, and a temporal distance between a same discharge sensed by the measurement probes.

8. The apparatus according to claim 7, wherein the processing unit further comprises a module for estimating an equivalent bandwidth and a rise time of the higher amplitude discharge, both provided to the diagnosis module.

9. The apparatus according to claim 1, wherein the processing unit further comprises a clusterization module upstream of the correlation measuring module and the module performing the time-frequency distribution, for clusterizing the acquired signals into respective clusters and producing signatures characterizing the acquired signals in the clusters, the correlation and the time-frequency distribution being achieved on the signatures.

10. A method for detecting, localizing and interpreting a partial discharge occurring in a partial discharge site along an electrical equipment, comprising:
  detecting pulses travelling in the electrical equipment using two measurement probes spaced from each other along the electrical equipment;
  detecting a phase angle in the electrical equipment using a synchronization probe positioned along the electrical equipment;
  performing a selective conditioning of signals representative of the detected pulses;
  acquiring the signals after the selective conditioning as a function of the detected phase angle;
  putting the acquired signals in correlation;
  presenting at least one of the acquired signals in a time-frequency distribution;
  estimating a form factor corresponding to a ratio of a spectral bandwidth over a time length of a discharge pulse derived from the time-frequency distribution; and
  interpreting the correlation and the form factor to generate a diagnosis indicative of a detection of a partial discharge and of a localization of the partial discharge along the electrical equipment as a function of results from the interpretation of the correlation and the form factor.

11. The method according to claim 10, further comprising:
  eliminating candidates of diagnosis solutions corresponding to traces in the acquired signals derived from detected pulses having out-of-range propagation delays between the measurement probes.

12. The method according to claim 11, further comprising:
  generating a test signal transmitted to the synchronization probe that injects the test signal in the electrical equipment; and
  determining the propagation delay between the measurement probes from the acquired signals corresponding to the pulses detected by the measurement probes caused by the test signal injected in the electrical equipment, a threshold for delays considered to be out-of-range being then set as a function of the propagation delay so determined.

13. The method according to claim 10, further comprising:
  generating a test signal transmitted to the synchronization probe that injects the test signal in the electrical equipment; and
  checking a configuration of the measurement probes as a function of the acquired signals corresponding to the test signal injected in the electrical equipment.

14. The method according to claim 10, further comprising:
  estimating a probability of error as a function of a ratio between a peak of a maximum of correlation among other correlation peaks, a warning signal indicative of multiple probable candidates of diagnosis explanation being produced when the probability of error exceeds a preset threshold.

15. The method according to claim 10, further comprising:
  detecting typical traces of radiation in the acquired signals, their processing being stopped and a radiation diagnosis being retained when a determination is made that the acquired signals correspond to radiation.

16. The method according to claim 10, wherein the diagnosis is also established based on a signal indicative of the polarities of the pulses in the acquired signals, a correlation factor of the correlated signals, a temporal trace portion of a higher amplitude discharge, a temporal distance between a same discharge sensed by the measurement probes, an equivalent bandwidth and a rise time of the higher amplitude discharge.

17. The method according to claim 10, wherein the form factor corresponds to the ratio of the spectral bandwidth over the time length of the discharge pulse in one of the acquired signals, the spectral bandwidth and the time length being estimated from a prevailing spectral line and a temporal marginal of the partial discharge provided in the time-frequency distribution.

18. The method according to claim 17, wherein the time-frequency distribution corresponds to a spectrogram, a Wigner-Ville transform, or to a wavelet transform of said at least one acquired signal.

19. The method according to claim 17, wherein the time-frequency distribution is first subjected to a time-frequency filtering prior to estimation of the form factor in order to remove background noise exhibiting a substantially constant spectral power in the time domain.

20. The method according to claim 10, further comprising: interpolating the acquired signals before correlation.

21. The method according to claim 10, further comprising clusterizing the acquired signals into respective clusters and producing signatures characterizing the acquired signals in the clusters, the correlation and the time-frequency distribution being achieved on the signatures.

22. A wideband magnetic probe for detecting pulses traveling in an electrical equipment, comprising:
  a removable clamp having a conductive loop forming a magnetic sensing circuit apt to surround a section of the electrical equipment in order to sense a signal representing a magnetic component of the pulses traveling in the electrical equipment;
  a conductive shield covering and electrostatically insulating the conductive loop, the conductive shield being in open circuit at opposite ends of the clamp so that a gap appears between the ends of the clamp;
  a connector closing the circuit of the conductive loop at the ends of the clamp where the gap is located when the clamp is installed around the electrical equipment; and
  a connector for establishing an external electrical connection with the circuit of the conductive loop.

23. The wideband magnetic probe according to claim 22, further comprising an amplifier circuit integrated in the conductive shield and inserted in the conductive loop in order to filter and amplify the signal.

24. The wideband magnetic probe according to claim 23, wherein the amplifier circuit has a controlled gain.

25. An apparatus for detecting partial discharges in an electrical equipment, comprising:
  a measurement probe and a synchronization probe installable along the electrical equipment so that pulses travelling in the electrical equipment are detectable by the measurement probe and a signal indicative of a phase angle in the electrical equipment is detectable by the synchronization probe;
  a control unit connecting to the measurement probe for receiving signals representative of the detected pulses, and connecting to the synchronization probe for acquiring the signal indicative of the phase angle, the control unit having a circuit for selective conditioning of the received signals; and
  a digital processing unit connecting to the control unit for acquiring the signals after selective conditioning as a function of an appraisal of the phase angle and driving the control unit, the digital processing unit having a clusterization module for clusterizing the acquired signals into respective clusters and producing signatures characterizing the signals in the clusters, a module for performing a time-frequency distribution of the signatures, a form factor estimating module for estimating a form factor corresponding to a ratio of a spectral bandwidth over a time length of a discharge pulse derived from the time-frequency distribution, a module for determining rise times of the signatures, and a diagnosis module configured for interpretation of the form factor and the rise times for generating a diagnosis indicative of a detection of partial discharges and producing a warning signal as a function of the diagnosis based on the interpretation.

26. A method for detecting partial discharges in an electrical equipment, comprising:
  detecting pulses travelling in the electrical equipment using a measurement probe positioned along the electrical equipment;
  detecting a signal indicative of a phase angle in the electrical equipment using a synchronization probe positioned along the electrical equipment;
  performing selective conditioning of signals representative of the detected pulses;
  acquiring the signals after the selective conditioning as a function of an appraisal of the phase angle;
  clusterizing the acquired signals into clusters and producing signatures characterizing the signals in the clusters;
  presenting the signatures in a time-frequency distribution;
  estimating a form factor corresponding to a ratio of a spectral bandwidth over a time length of a discharge pulse derived from the time-frequency distribution;
  determining rise times of the signatures;
  interpreting the form factor and the rise times to generate a diagnosis indicative of a detection of partial discharges as a function of results from the interpretation of the form factor and the rise times; and
  producing a warning signal as a function of the diagnosis based on the interpretation.

27. An apparatus for detecting partial discharges in an electrical equipment, comprising:
  a measurement probe and a synchronization probe installable along the electrical equipment so that pulses travelling in the electrical equipment are detectable by the measurement probe and a signal indicative of a phase angle in the electrical equipment is detectable by the synchronization probe;
  a control unit connecting to the measurement probe for receiving signals representative of the detected pulses, and connecting to the synchronization probe for acquiring the signal indicative of the phase angle, the control unit having a circuit for selective conditioning of the received signals; and
  a digital processing unit connecting to the control unit for acquiring the signals after selective conditioning considering the phase angle and driving the control unit, the digital processing unit having a clusterization module for clusterizing the acquired signals into respective clusters and producing time signatures characterizing the signals in the clusters, a module for determining characteristic elements of the signatures based on predetermined analysis parameters, and a diagnosis module configured for interpretation of the characteristic elements for generating a diagnosis indicative of a detection of partial discharges and producing a warning signal as a function of the diagnosis based on the interpretation.

28. A method for detecting partial discharges in an electrical equipment, comprising:
  detecting pulses travelling in the electrical equipment using a measurement probe positioned along the electrical equipment;
  detecting a signal indicative of a phase angle in the electrical equipment using a synchronization probe positioned along the electrical equipment;
  performing selective conditioning of signals representative of the detected pulses;
  acquiring the signals after the selective conditioning considering the phase angle;
  clusterizing the acquired signals into clusters and producing time signatures characterizing the signals in the clusters;
  determining characteristic elements of the signatures based on predetermined analysis parameters;
  interpreting the characteristic elements to generate a diagnosis indicative of a detection of partial discharges as a function of results from the interpretation of the characteristic elements; and
  producing a warning signal as a function of the diagnosis.

* * * * *